United States Patent
Koizumi

(10) Patent No.: US 8,589,840 B2
(45) Date of Patent: Nov. 19, 2013

(54) SEMICONDUCTOR CHIP DESIGN VERIFICATION DEVICE

(75) Inventor: Ryoji Koizumi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 189 days.

(21) Appl. No.: 12/914,801

(22) Filed: Oct. 28, 2010

(65) Prior Publication Data

US 2011/0119645 A1 May 19, 2011

(30) Foreign Application Priority Data

Nov. 17, 2009 (JP) .................... 2009-262150

(51) Int. Cl.
*G06F 9/455* (2006.01)
*G06F 17/50* (2006.01)

(52) U.S. Cl.
USPC ............. 716/106; 716/52; 716/110; 716/111; 716/112

(58) Field of Classification Search
USPC ............. 716/52, 106, 110, 111, 112
See application file for complete search history.

(56) References Cited

U.S. PATENT DOCUMENTS

| 7,409,652 B1 * | 8/2008 | Fox et al. ................ 716/106 |
| 2004/0088674 A1 * | 5/2004 | Kato et al. ................ 716/18 |
| 2005/0071792 A1 * | 3/2005 | Ferguson et al. ................ 716/4 |
| 2007/0201442 A1 * | 8/2007 | Hekmatpour et al. ........ 370/356 |
| 2008/0208886 A1 * | 8/2008 | Zhang .................... 707/102 |

FOREIGN PATENT DOCUMENTS

| JP | 2001-222571 A | 8/2001 |
| JP | 2007-507041 A | 3/2007 |
| WO | WO 2005/043283 A2 | 5/2005 |

OTHER PUBLICATIONS

"An Open IP Encryption Flow Permits Industry-Wide Interoperability", by Synplicity @ Jun. 2006.*

* cited by examiner

*Primary Examiner* — Nha Nguyen

(74) *Attorney, Agent, or Firm* — Arent Fox LLP

(57) ABSTRACT

A disclosed device includes a verification unit which performs a data verification of chip design data, an obtaining unit which obtains encryption IP and a verification result output unit which outputs a result of the data verification. The chip design data is designed by using the box IP, the box IP being data which can be disclosed to a chip designer in hardware IP. The encryption IP is the IP including part or all of data of the hardware IP being encrypted. The verification unit decrypts the encryption IP to the hardware IP and replaces the box IP of the chip design data with the decrypted hardware IP so as to perform the data verification, in the storage area such as RAM where storage data is hidden from outside.

4 Claims, 21 Drawing Sheets

DISTRIBUTION SYSTEM OF DISCLOSABLE HARDWARE IP

DISTRIBUTION SYSTEM OF BOX IP AND ENCRYPTION IP

DESCRIPTION EXAMPLE OF CONTROL FILE (1)

EXAMPLE OF STORING CHIP LAYOUT DATA

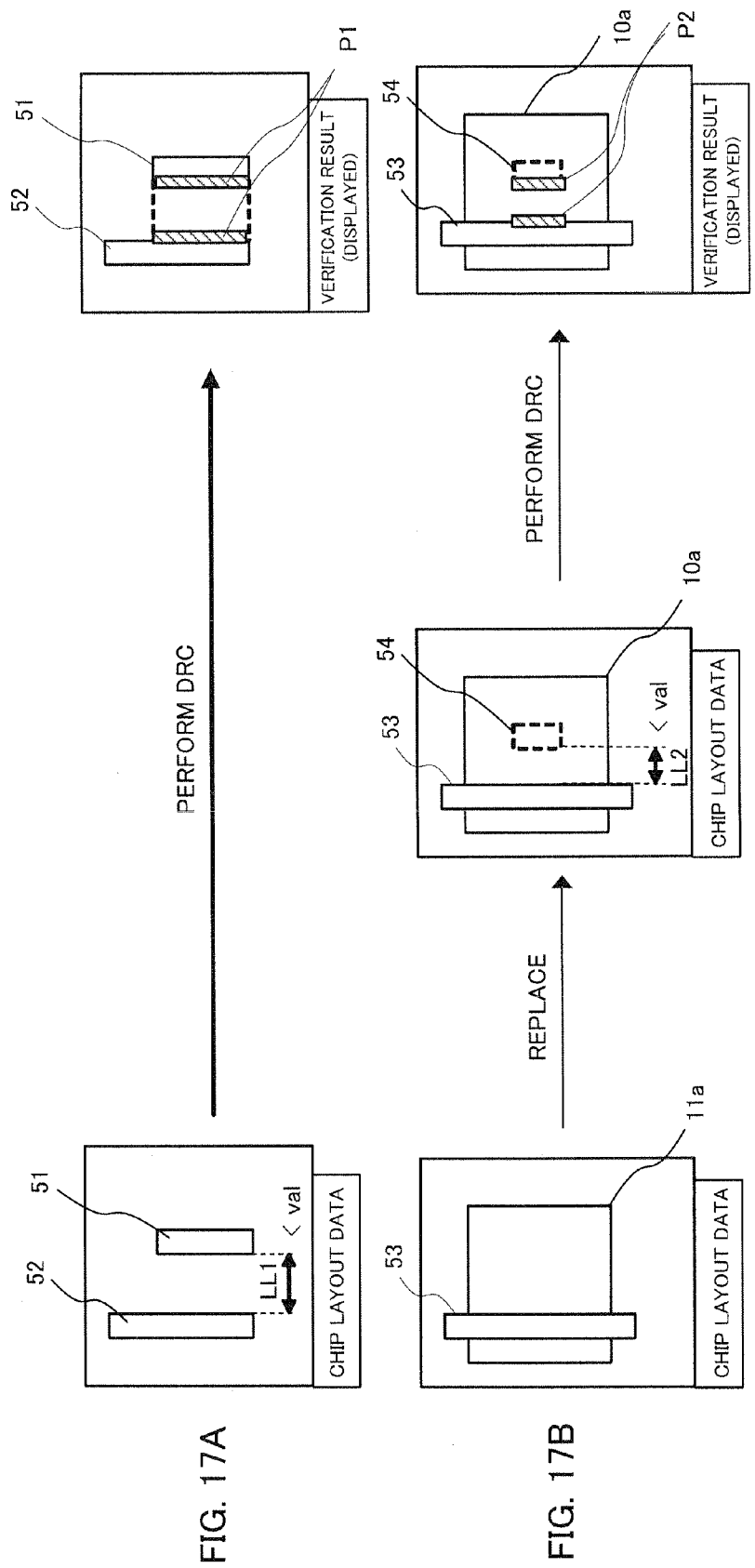

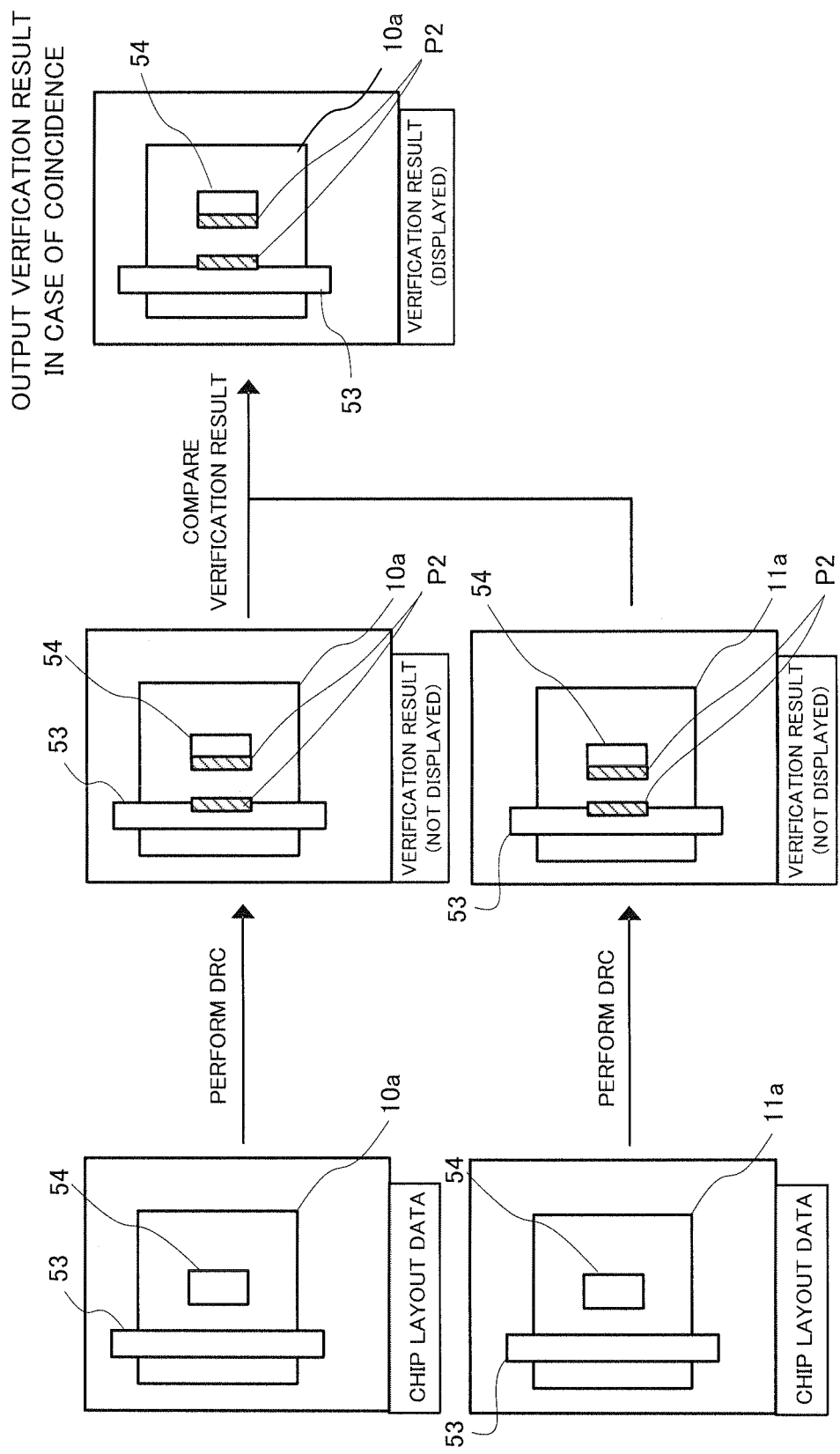

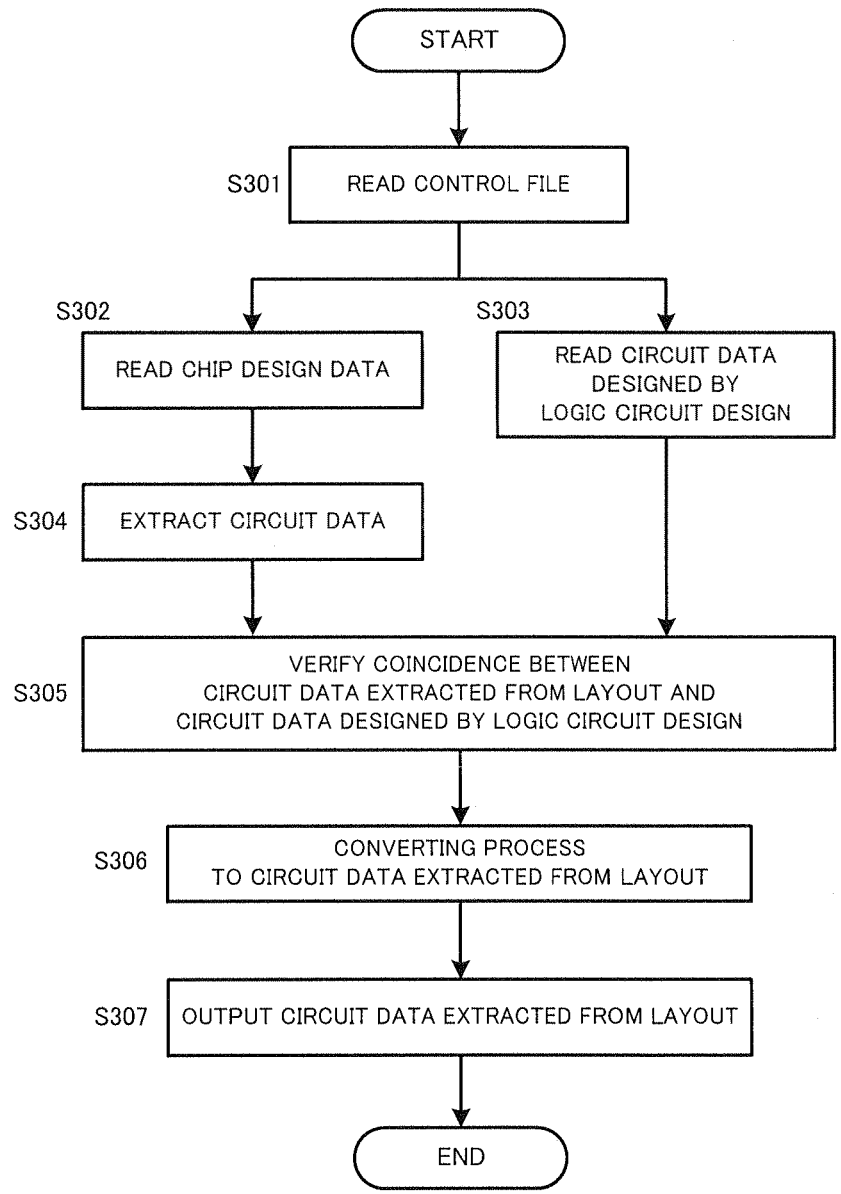

SEMICONDUCTOR CHIP DESIGN VERIFICATION DEVICE

CROSS-REFERENCE TO RELATED APPLICATIONS

This application is based upon and claims the benefit of priority of the prior Japanese Patent Application No. 2009-262150 filed on Nov. 17, 2009, the entire contents of which are incorporated herein by reference.

FIELD

This invention relates to a design verification device, a design verification method and a computer readable medium storing a design verification program, which verify a chip design of a semiconductor integrated circuit (LSI).

BACKGROUND

As for a chip design of the LSI, after a logic circuit design is performed in the upper process, a layout design is performed based on the data obtained by the logic circuit design. As a high integration of the LSI is advanced, since there is a limit on a manual design, an automatic design using a computer instead of the manual design is used. In recent years, an automatic design supporting development tool called EDA (Electronic Design Automatic) is used in the chip design by the computer.

In addition, IP (Intellectual Properties) is distributed for the purpose of shortening a design development period of the LSI. The IP is reusable data organized by a functional unit of a circuit block of the LSI and is provided to a chip designer by an IP provider. The IP is generally divided into software IP and hardware IP. Since the software IP is provided as function description data, the chip designer needs to determine a layout of the software IP and confirm manufacturing validity of it. In contrast, as for the hardware IP, while only a particular manufacturer can manufacture a chip using it, since the hardware IP is provided in a form including layout data and it is able to be manufactured and its behavior is ensured, there is such a merit that the design is easy, compared with the software IP.

By the way, since the hardware IP is provided in a form including layout data and netlist, confidential information including design know-how and circuit information of the hardware IP may be revealed to the chip designer. Therefore, it is considered that the data in the hardware IP which can be disclosed to the chip designer is provided to the chip designer as box IP. However, while the chip designer can perform the chip design itself in case of using the box IP, the chip designer may be unable to sufficiently perform data verifications such as a design pattern check. Therefore, it may cause a difference between a result of a data verification by the chip designer and a result of a data verification in case of using the hardware IP which is performed later by a chip manufacturer. In this case, since an operation returns to the chip design step, it causes a delay of the chip design development. Additionally, in such a case that the chip designer performs the layout design by setting an excessive margin for the purpose of preventing it, the size of the chip may become larger.

SUMMARY

A disclosed device includes a verification unit which performs a data verification of chip design data, an obtaining unit which obtains encryption IP and a verification result output unit which outputs a result of the data verification. The verification unit, the obtaining unit and the verification result output unit are realized by executing programs on CPU (Central Processing Units) in PC (Personal Computer), for example. The chip design data is designed by using the box IP, the box IP being data which can be disclosed to a chip designer in hardware IP. The encryption IP is the IP including part or all of data of the hardware IP being encrypted. The verification unit decrypts the encryption IP to the hardware IP and replaces the box IP of the chip design data with the decrypted hardware IP so as to perform the data verification, in the storage area such as RAM where storage data is hidden from outside.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 17A and 17B are diagrams showing display examples in case of performing DRC verification;

FIG. 20 is a diagram showing a display example in case of converting a configuration of an error flag and outputting it;

FIG. 21 is a flow chart showing an example of a LVS verification process.

DESCRIPTION OF EMBODIMENTS

An example of an embodiment will now be described below with reference to the attached drawings.

[First Embodiment]

First, a description will be given of a first embodiment. In the first embodiment, a description will be given of a method for improving efficiency of a chip design and a verification operation by using hardware IP.

At first, a description will be given of an example of a distribution system of the hardware IP by dividing into a case of being able to disclose the data of the hardware IP to the chip designer and a case of being unable to disclose the data of the hardware IP to the chip designer.

Figure 1:
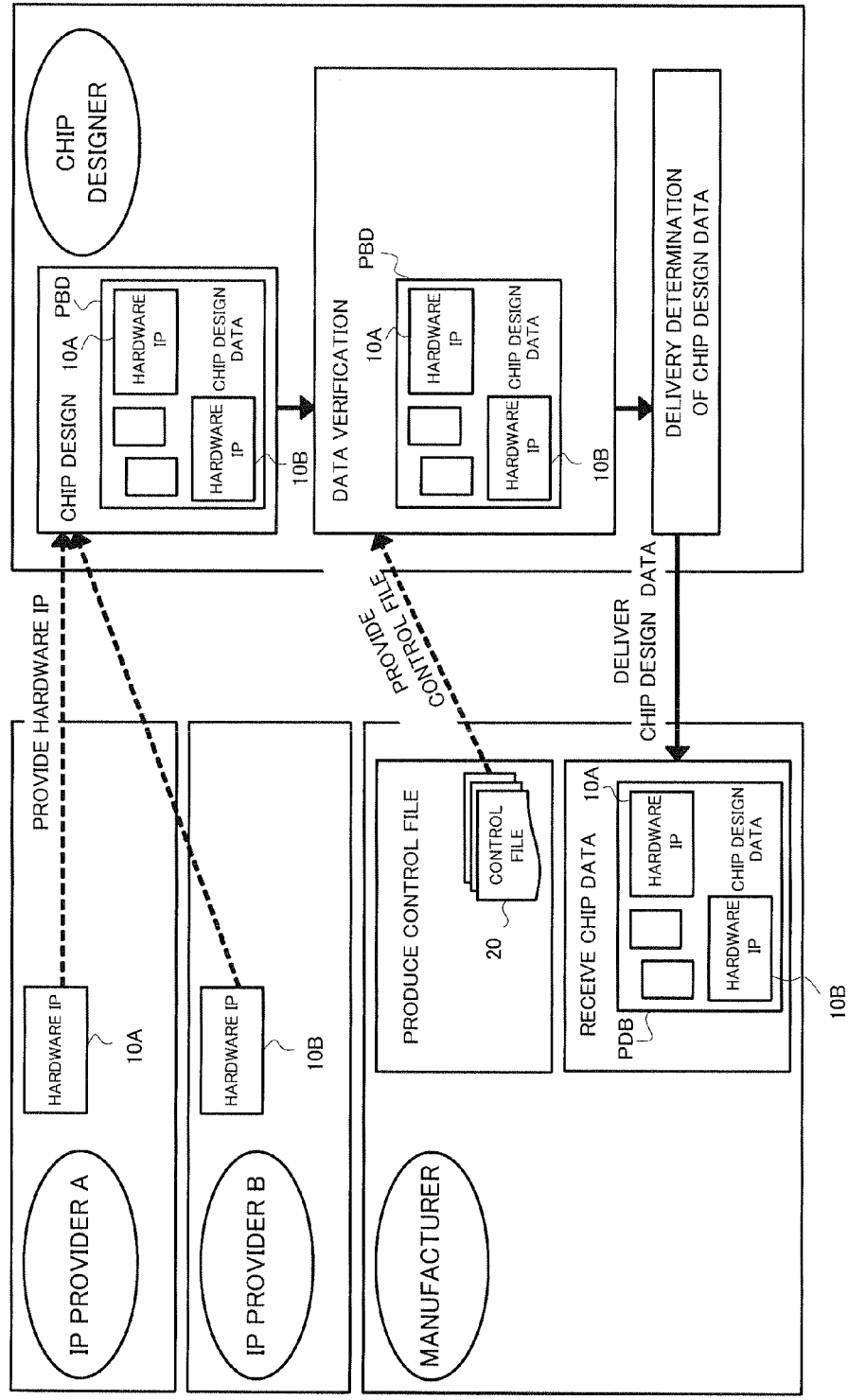
FIG. 1 is a diagram showing an example of a distribution system of disclosable hardware IP.

FIG. 1 shows an example of the distribution system in case of being able to disclose the data of the hardware IP to the chip designer. The hardware IP includes the layout data, the netlist and the function description data, which are organized by the functional unit of the circuit block.

In case of being able to disclose the data of the hardware IP to the chip designer, the IP provider provides the hardware IP to the chip designer. In the example shown in FIG. 1, the IP providers A and B provide the hardware IP 10A and 10B to the chip designer. The chip designer performs the chip design by using the hardware IP 10A and 10B. For example, the chip designer performs the layout design of the chip by using each layout data of the hardware IP 10A and 10B and produces the layout data of the chip (hereinafter referred to as "chip layout data"). In addition, for example, the chip designer produces the netlist of the chip (hereinafter referred to as "chip netlist") by using each netlist of the hardware IP 10A and 10B. Hereinafter, the design data of the chip including the chip layout data and the chip netlist is collectively referred to as "chip design data". Namely, the chip designer performs the chip design by using the hardware IP 10A and 10B so as to produce the chip design data PBD.

The chip designer performs the data verification of the chip design data PBD produced in the chip design by using the design verification devices such as EDA (Electronic Design Automation). Concretely, the chip designer inputs the chip design data PBD and the control file 20 provided by the manufacturer of the chip to the design verification device. The process of the data verification and the criterion for the determination are described in the control file 20. The design verification device performs the data verification of the chip design data PBD in accordance with the control file 20 and outputs the result of the verification. For example, the data verification includes DRC (Design Rule Checking), LVS (Layout Versus Schematic) and DFM (Design For Manufacturability). The DRC verification verifies whether or not the chip layout data satisfies the design rule. The LVS verification verifies whether or not the circuit data derived from the chip layout data coincides with the circuit data designed in the design step of the logic circuit. The DFM verification verifies whether or not the chip can be manufactured easily based on the chip design data. The design verification device verifies whether or not the chip design data PBD satisfies the verification criterion of the verification data and outputs the result of the verification.

When the chip designer determines that the chip design data PBD satisfies the verification criterion based on the result of the verification, the chip designer delivers the chip design data PBD to the manufacturer. The manufacturer receives the chip design data PBD from the chip designer.

FIG. 1 shows the distribution system in case of being able to disclose the data of the hardware IP to the chip designer. In contrast, the IP provider sometimes does not want to disclose the data of the hardware IP to the chip designer. A description will be given of an example of a distribution system in this case, with reference to FIG. 2.

Figure 2:
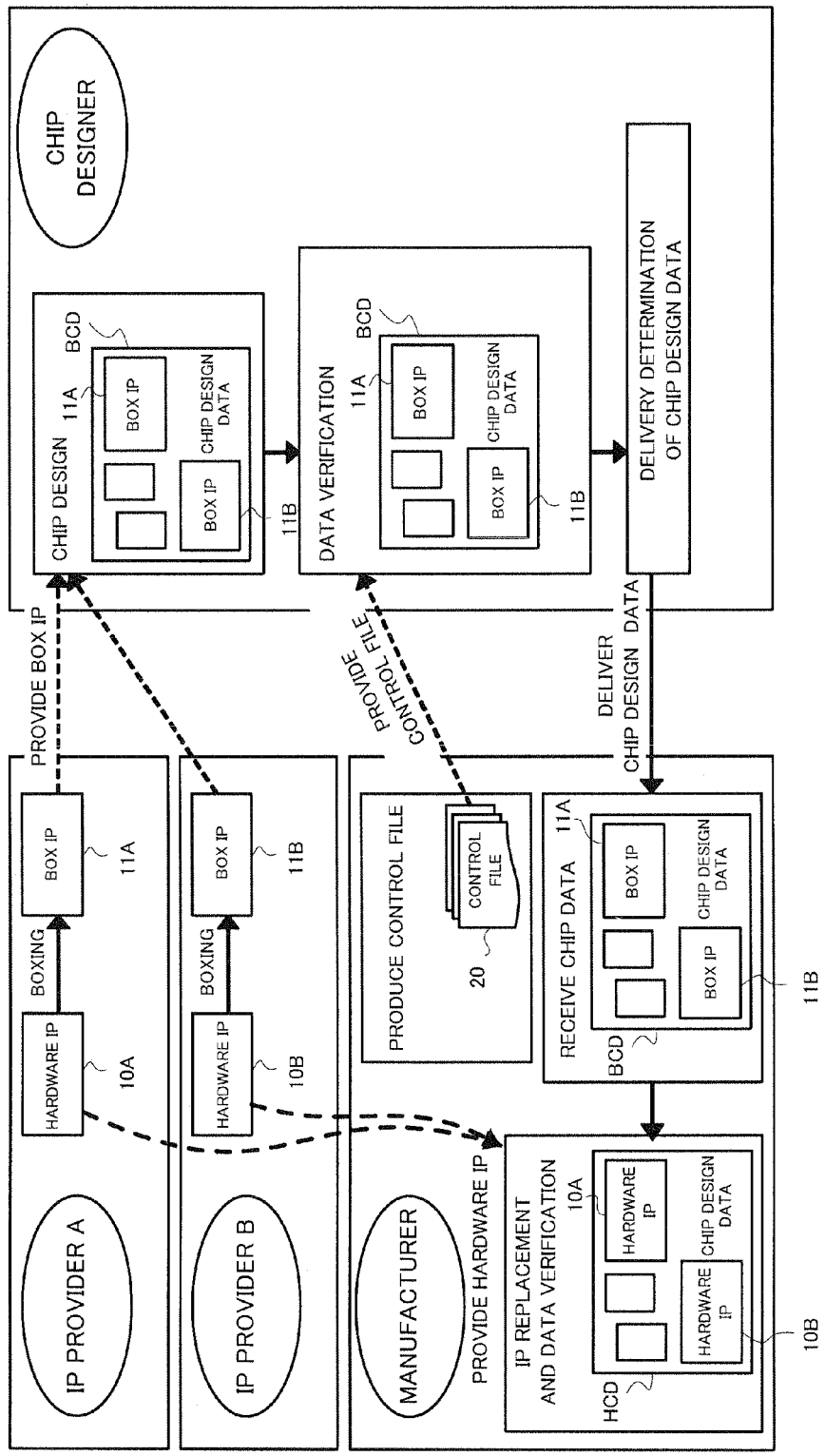
FIG. 2 is a diagram showing an example of a distribution system of not disclosable hardware IP.

FIG. 2 shows an example of the distribution system in case of being unable to disclose the data of the hardware IP to the chip designer.

In case of being unable to disclose the data of the hardware IP to the chip designer, the IP provider performs boxing to the hardware IP and provides the box IP to the chip designer. The "boxing" means extracting the data which can be disclosed to the chip designer from the data of the hardware IP. Namely, the IP provider extracts the data which can be disclosed to a chip designer from the data of the hardware IP, and provides the extracted disclosable data to the chip designer as the box IP. Here, a description will be given of an example of a method for producing the box IP, with reference to FIG. 3.

Figure 3:
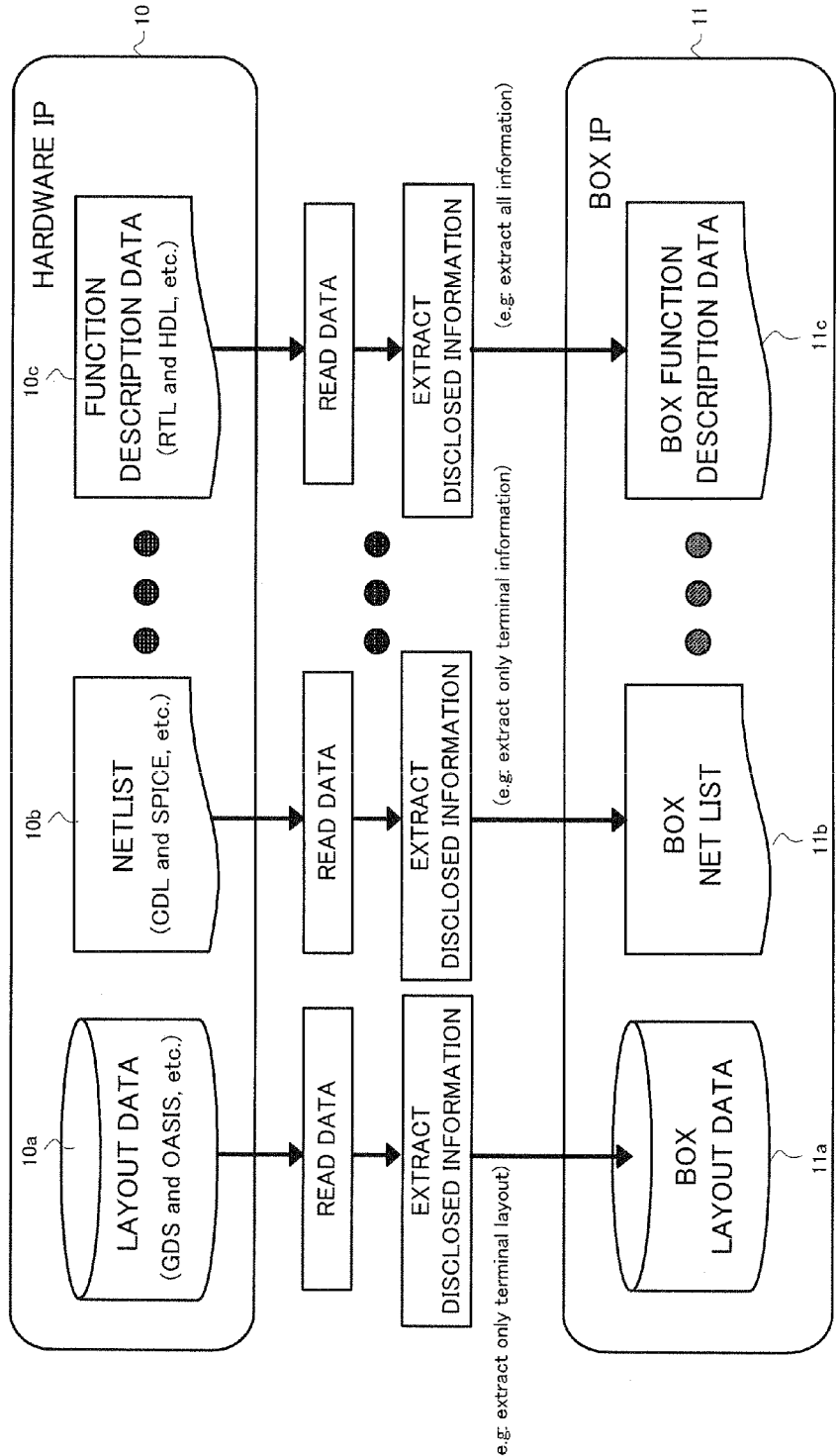
FIG. 3 is a diagram showing an example of a method for producing box IP.

As shown in FIG. 3, for example, the information of the disclosable terminal layout is extracted from the layout data 10$a$ of the hardware IP 10, and the information of the extracted terminal layout is set to the layout data 11$a$ of the box IP 11. Hereinafter, the layout data of the box IP 11 is referred to as "box layout data". Additionally, for example, the terminal information such as the identifier indicating the type of the terminal is extracted from the netlist 10$b$ of the hardware IP 10, and the extracted terminal information is set to the netlist 11$b$ of the box IP 11. Hereinafter, the netlist of the box IP 11 is referred to as "box netlist". Additionally, for example, the function description data 10$c$ of the hardware IP 10 is directly set to the box function description data 11$c$ which is the function description data of the box IP 11. Thus, the data which can be disclosed to a chip designer in each data of the hardware IP is set to each data of the box IP.

By going back to FIG. 2, an explanation is continued. The IP providers A and B perform the boxing of the hardware IP 10A and 10B so as to produce the box IP 11A and 11B, and provide the box IP 11A and 11B to the chip designer.

The chip designer performs the chip design by using the box IP 11A and 11B so as to produce the chip design data BCD. As the detailed explanation will be given later, for example, the chip designer performs the layout design of the chip by using each box layout data of the box IP 11A and 11B and produces the chip layout data which is the layout data of the chip. Additionally, the chip designer produces the chip netlist, which is the netlist of the chip, by using each box netlist of the box IP 11A and 11B.

The chip designer performs the data verification of the chip design data BCD produced in the chip design by using the design verification device. Concretely, like the method shown in FIG. 1, the design verification device performs the data verifications such as the DRC, the LVS and the DFM of the chip design data BCD in accordance with the control file 20 provided by the manufacturer of the chip. When the chip designer determines that the chip design data BCD satisfies the verification criterion based on the result of the verification, the chip designer delivers the chip design data BCD to the manufacturer.

The manufacturer receives the hardware IP 10A and 10B from the IP providers A and B. When the manufacturer receives the chip design data BCD from the chip designer, the manufacturer replaces the box IP 11A and 11B in the chip design data BCD with the hardware IP 10A and 10B so as to produce the chip design data HCD. Then, the manufacturer performs the data verification of the chip design data HCD by using the design verification device once again. Concretely, the design verification device performs the data verifications such as the DRC, the LVS and the DFM of the chip design data HCD in accordance with the control file 20. When the manufacturer determines that the chip design data HCD satisfies the verification criterion from the result of the data verification, the manufacturer starts manufacturing the chip based on the chip design data HCD.

Figure 4:
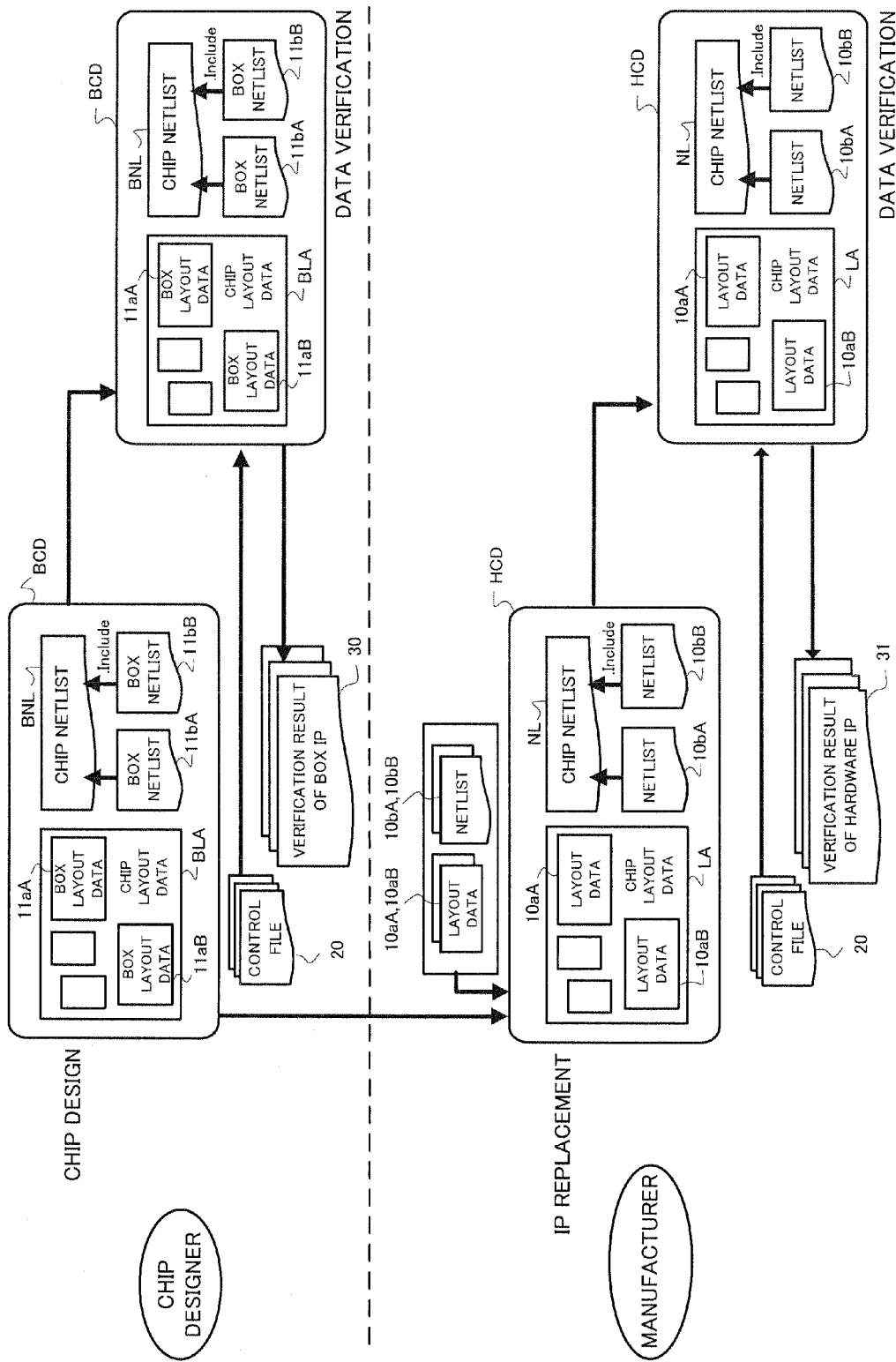
FIG. 4 is a diagram showing an example of a flow of a design and verification operation of a distribution system.

Next, the detailed explanation will be given of a flow of the design and the verification operation of the distribution system shown in FIG. 2, with reference to FIG. 4. FIG. 4 is a diagram showing an example of the flow of the design and the verification operation of the distribution system shown in FIG. 2.

Hereinafter, the layout data and the netlist of the hardware IP 10A are referred to as the layout data 10aA and the netlist 10bA, respectively. Additionally, the box layout data and the box netlist of the box IP 11A are referred to as the box layout data 11aA and the box netlist 11bA, respectively. The box layout data 11aA is the disclosable data which is extracted from the layout data 10aA and the box netlist 11bA is the disclosable data which is extracted from the netlist 10bA.

Hereinafter, the layout data and the netlist of the hardware IP 10B are referred to as the layout data 10aB and the netlist 10bB, respectively. Additionally, the box layout data and the box netlist of the box IP 11B are referred to as the box layout data 11aB and the box netlist 11bB, respectively. The box layout data 11aB is the disclosable data which is extracted from the layout data 10aB and the box netlist 11bB is the disclosable data which is extracted from the netlist 10bB.

As shown in FIG. 4, the flow of the operation is performed by the chip design, the data verification by the chip designer, the IP replacement and the data verification by the manufacturer, in that order. A description will be given step by step.

In the chip design step, the chip designer produces the chip design data BCD by using the box IP 11A and 11B. For example, the chip designer performs the layout design of the chip by using the box layout data 11aA of the box IP 11A and the box layout data 11aB of the box IP 11B so as to produce the chip layout data BLA. Additionally, the chip designer produces the chip netlist BNL, which is the circuit data of the chip, by using the box netlist 11bA of the box IP 11A and the box netlist 11bB of the box IP 11B.

In the data verification step by the chip designer, the chip designer performs the data verification of the chip design data BCD produced in the chip design step by using the design verification device. Concretely, the design verification device performs the process of the data verifications such as the DRC, the LVS and the DFM of the chip design data BCD in accordance with the process described in the control file 20. The design verification device outputs the result of the data verification as the verification result 30 of the hardware IP. The chip designer checks the output verification result 30 and determines whether or not to deliver the chip design data BCD to the manufacturer.

Figure 5:
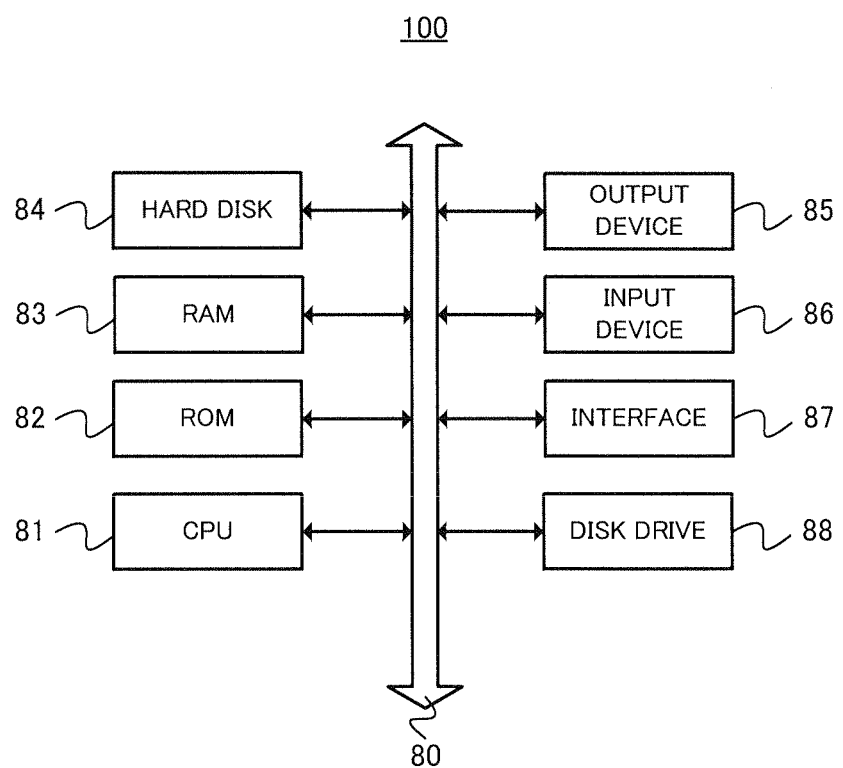
FIG. 5 is a configuration diagram showing a configuration of an example of a design verification device.

Here, a description will be given of a concrete hardware configuration of the design verification device. FIG. 5 is a configuration diagram showing a configuration of a design verification device 100 which is an example of the design verification device.

As shown in FIG. 5, the design verification device 100 is a computer such as PC (Personal Computer), and includes a CPU (Central Processing Unit) 81, a ROM (Read Only Memory) 82, a RAM (Random Access Memory) 83 and a hard disk 84. Additionally, the design verification device 100 includes an output device 85, an input device 86, an interface 87 and a disk drive 88. These components are connected to the bus 80. The output device 85 includes the output devices such as a monitor and a printer, and the input device 86 includes the input devices such as a mouse and a keyboard. The interface 87 includes the external connection interfaces such as a USB (Universal Serial Bus). The disk drive 88 includes the disk drive for driving the disks such as a DVD (Digital Versatile Disk). The CPU 81 executes the program stored in the ROM 82 and the data verification is performed.

As for the concrete operation of the design verification device 100 in the data verification step by the chip designer, at first, the chip design data BCD and the control file 20 are input to the design verification device 100 via the interface 87. Then, when the program stored in the ROM 82 is executed, the CPU 81 performs the data verifications such as the DRC, the LVS and the DFM of the chip design data BCD in accordance with the process described in the control file 20. The CPU 81 outputs the result of the data verification, as the verification result 30 of the box IP, to the output device 85.

In the IP replacement step, the manufacturer receives the chip design data BCD from the chip designer and replaces the box IP 11A and 11B in the received chip design data BCD with the hardware IP 10A and 10B so as to produce the chip design data HCD. For example, the manufacturer replaces the box layout data in the chip layout data BLA with the layout data in the hardware IP so as to produce the chip layout data LA. Concretely, in this case, the box layout data 11aA is replaced with the layout data 10aA in the hardware IP 10A and the box layout data 11aB is replaced with the layout data 10aB in the hardware IP 10B. Additionally, the manufacturer replaces the box netlist in the chip netlist BNA with the netlist in the hardware IP so as to produce the chip netlist NL. Concretely, in this case, the box netlist 11bA is replaced with the netlist 10bA in the hardware IP 10A and the box netlist 11bB is replaced with the netlist 10bB in the hardware IP 10B.

In the data verification step by the manufacturer, the manufacturer performs the data verification of the chip design data HCD, for which the IP replacement is performed, by using the design verification device.

Concretely, like the data verification by the chip designer, the manufacturer inputs the chip design data HCD and the control file 20 to the design verification device. Then, like the data verification by the chip designer, the design verification device performs the data verifications such as the DRC, the LVS and the DFM of the chip design data HCD in accordance with the process described in the control file 20. The design verification device outputs the result of the data verification as the verification result 31 of the hardware IP. When the manufacturer determines that the chip design data HCD satisfies the verification criterion based on the verification result 31, the manufacturer starts manufacturing the chip based on the chip design data HCD.

As understood from the above explanation, there are the case of performing the data verification of the chip design data BCD for which the box IP 11A and 11B is used, and the case of performing the data verification of the chip design data HCD which is replaced with the hardware IP 10A and 10B.

Figure 6:
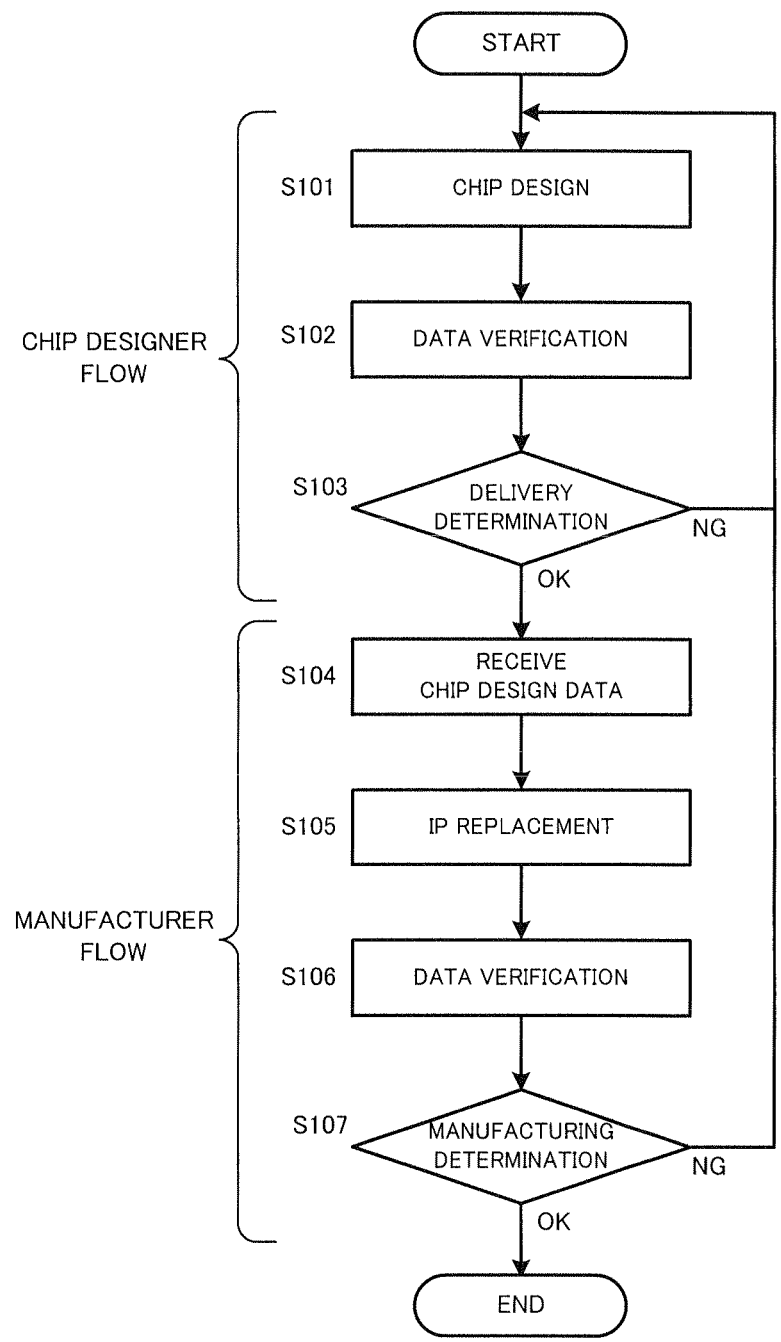
FIG. 6 is a flow chart showing a flow of a design and verification operation.

Next, a description will be given of a flow of the above design and verification operation, by using a flow chart shown in FIG. 6. FIG. 6 is the flow chart showing the flow of the above design and verification operation.

First, in step S101, the chip designer produces the chip design data BCD by using the box IP, as the chip design step.

In step S102, the chip designer performs the data verifications such as the DRC, the LVS and the DFM of the chip design data BCD by using the design verification device and determines the verification result 30 of the box IP, as the data verification step by the chip designer.

In step S103, the chip designer checks the verification result 30 of the box IP and determines whether or not to deliver the chip design data BCD to the manufacturer. When the chip designer determines that the chip design data BCD satisfies the verification criterion from the result of the data verification, the chip designer delivers the chip design data BCD to the manufacturer (step S103: OK). Meanwhile, when the chip designer determines that the chip design data BCD does not satisfy the verification criterion, the chip designer determines that there is a problem in the chip design. Then, the chip designer does not deliver the chip design data BCD (step S103: NG), and the process goes back to the chip design in step S101.

In step S104, the manufacturer receives the chip design data BCD from the chip designer. Next, in step S105, the manufacturer replaces the box IP in the chip design data BCD with the hardware IP so as to produce the chip design data HCD, as the IP replacement step.

In step S106, the manufacturer performs the data verifications such as the DRC, the LVS and the DFM of the chip design data HCD by using the design verification device and determines the verification result 31 of the hardware IP, as the data verification step by the manufacturer.

In step S107, the manufacturer checks the verification result 31 of the hardware IP and determines whether or not to start manufacturing the chip. When the manufacturer determines that the chip design data HCD satisfies the verification criterion from the result of the data verification, the manufacturer starts manufacturing the chip (step S107: OK). Meanwhile, when the manufacturer determines that the chip design data HCD does not satisfy the verification criterion, the manufacturer determines that there is a problem in the chip design. Then, the manufacturer does not start manufacturing the chip (step S107: NG), and the process goes back to the chip design in step S101.

Here, in step S107, the case of going back to the chip design in step S101 is the case that the result of the data verification by the chip designer is different from the result of the data verification by the manufacturer. In other words, it is the case that, while the chip designer determines that the verification result 30 of the data verification satisfies the verification criterion, the manufacturer determines that the verification result 31 of the data verification does not satisfy the verification criterion.

Figure 7:
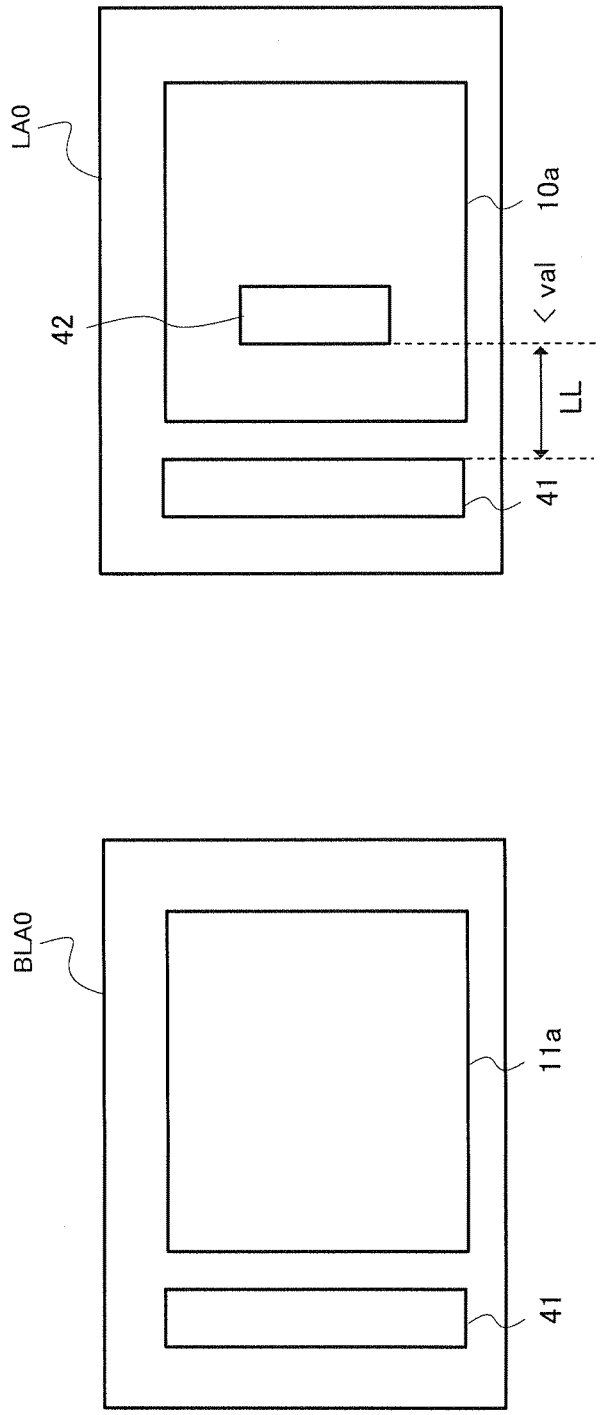
FIGS. 7A and 7B are diagrams showing examples of chip layout data.

As an example of causing the above difference of the result of the data verification, a description will be given of an example of the case of performing the DRC verification of an adjacent arrangement of the pattern. FIG. 7A shows an example of the chip layout data in case of performing the chip design by using the box layout data 11a, and FIG. 7B shows an example of the chip layout data in case of replacing the box layout data 11a with the layout data 10a of the hardware IP 10.

As for the chip layout data BLA0 shown in FIG. 7A, the pattern 41 such as the gate is arranged near the box layout data 11a. The box layout data 11a does not disclose the information of the arrangement of the patterns such as the gate inside it. Here, for example, it is assumed that there is such a design rule that "the distance between the patterns must be set to Val or more", and that the verification whether or not the design rule is satisfied is performed as the DRC verification.

The chip designer performs the DRC verification of the chip layout data BLA0 shown in FIG. 7A, by using the design verification device. As for the chip layout data BLA0 shown in FIG. 7A, since the box layout data 11a does not disclose the gate arrangement information, it is supposed that another pattern adjacent to the pattern 41 does not exist. Therefore, if the DRC verification is performed, the result is that the chip layout data BLA0 shown in FIG. 7A satisfies the above design rule.

Here, as shown in FIG. 7B, if the box layout data 11a is replaced with the layout data 10a of the hardware IP 10, it is understood that the pattern 42 which is adjacent to the pattern 41 and is arranged at the distance LL from the pattern 41 actually exists. The manufacturer performs the similar DRC verification of the chip layout data LA0 shown in FIG. 7B, by using the design verification device. Then, since the distance LL between the pattern 41 and the pattern 42 is shorter than Val, the result is that the chip layout data LA0 shown in FIG. 7B does not satisfy the above design rule. Namely, the result of the data verification by the chip designer is different from the result of the data verification by the manufacturer.

Thus, as for the chip layout data for which the box layout data is used, since it is difficult to confirm the state of the adjacent arrangement of the pattern, it is difficult to sufficiently perform the DRC verification. Therefore, the result of the data verification by the chip designer may be different from the result of the data verification by the manufacturer. Similarly, since it is difficult to confirm the state of the adjacent arrangement of the pattern, it is difficult to sufficiently perform the verification of the mutual interference at the time of performing the OPC (Optical Proximity Correction) and the verification of the flatness at the time of performing the CMP (Chemical Mechanical Polishing). Additionally, as for the chip layout data for which the box IP is used, it is also difficult to sufficiently perform the verification of the consistency between the circuit block which is the object of the box IP and the circuit connected to the circuit block. The verification example of the circuit connection includes the reliability verifications such as the timing analysis, the antenna effect, the stress migration and the electronic migration. When these verifications of the circuit connection are performed, the result of the data verification by the chip designer may be different from the result of the data verification by the manufacturer.

Every time the above-mentioned difference of the results of the data verification occurs, the operation returns to the chip design step. So, it is preferable to prevent the difference of the results of the data verification from occurring.

Therefore, in the first embodiment, in the data verification step by the chip designer, the design verification device performs the data verification by using the encryption IP including part or all of the data of the hardware IP being encrypted. Hereinafter, the concrete explanation will be given by using FIG. 8.

Figure 8:
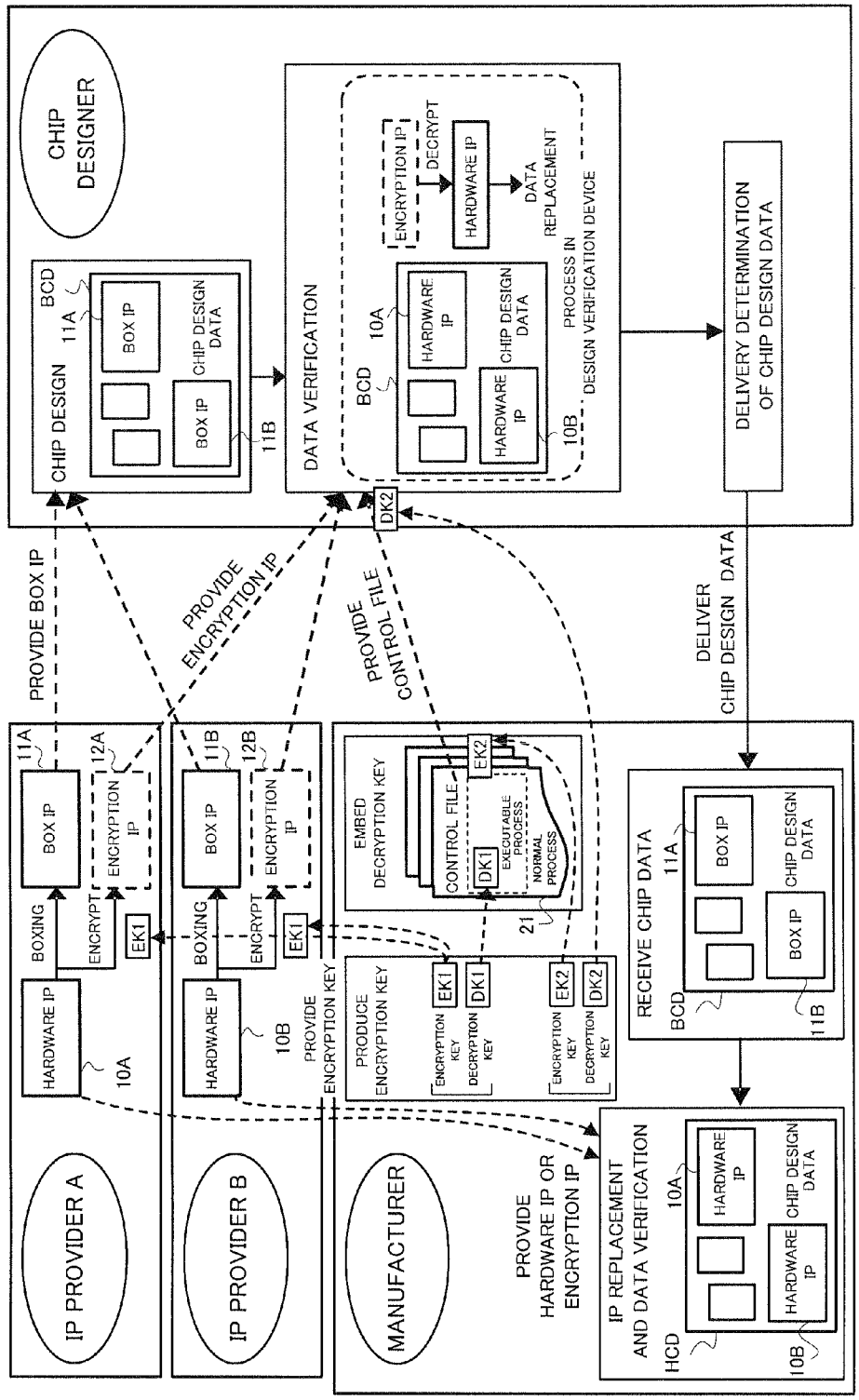
FIG. 8 is a diagram showing an example of a distribution system of encryption IP.

FIG. 8 shows an example of the distribution system of the encryption IP.

In the distribution system of the encryption IP, the IP provider performs the boxing to produce the box IP and produces the encryption IP including part or all of the data of the hardware IP being encrypted, by using the encryption key EK1. Here, the manufacturer produces the encryption key EK1 and the decryption key DK1 which is used for the decryption of the encryption IP.

The IP provider produces the box IP and the encryption IP by using the device such as the EDA. Hereinafter, the device such as the EDA, which has the function to produce the box IP and the encryption IP, is referred to as "IP producing device". The IP producing device is realized by executing the program on CPU in PC, for example.

Figure 9:
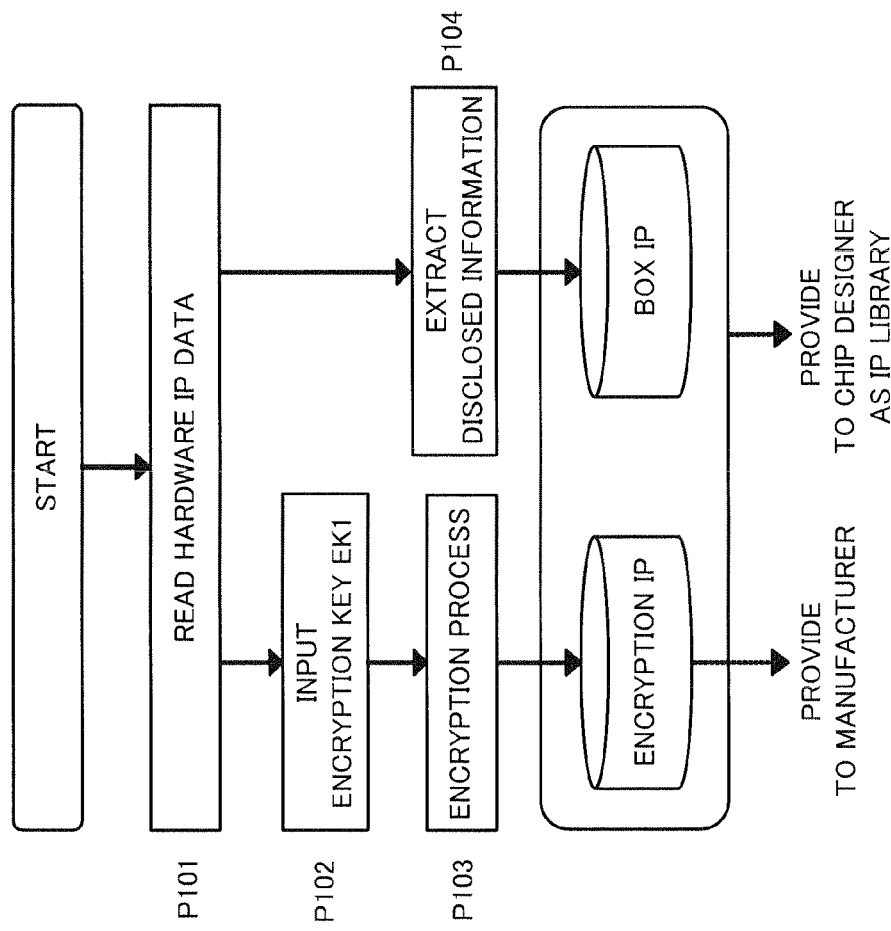
FIG. 9 is a flow chart showing a producing method of encryption IP.

Concretely, as shown in a flow chart of a producing method of the encryption IP in FIG. 9, at first, the IP producing device reads the data of the hardware IP such as the layout data and the netlist (step P101). Next, the IP producing device reads the encryption key EK1 (step P102), and performs the encryption process for encrypting part or all of the data of the hardware IP (step P103), so as to produce the encryption IP. On the other hand, based on the read data of the hardware IP, the IP producing device extracts the data such as the above box layout data and box netlist which can be disclosed to the chip designer (step P104), and produces the box IP. The box IP and the encryption IP are provided to the chip designer, as the IP library. Additionally, the encryption IP is also provided to the manufacturer.

In the example shown in FIG. 8, the encryption IP 12A including part or all of the data of the hardware IP 10A being encrypted and the box IP 11A including the disclosable data in the hardware IP 10A being extracted are produced from the hardware IP 10A. Additionally, the encryption IP 12B including part or all of the data of the hardware IP 10B being encrypted and the box IP 11B including the disclosable data in the hardware IP 10B being extracted are produced from the hardware IP 10B.

As described above, the IP providers A and B provide the box IP 11A and 11B and the encryption IP 12A and 12B to the chip designer. Additionally, the IP providers A and B provide the encryption IP 12A and 12B to the manufacturer. Instead of providing the encryption IP 12A and 12B to the manufacturer, the IP providers A and B may provide the hardware IP 10A and 10B to the manufacturer.

Like the method shown in FIG. 2, the chip designer performs the chip design by using the box IP 11A and 11B and produces the chip design data BCD. Then, the chip designer performs the data verifications such as the DRC, the LVS and the DFM of the chip design data BCD by using the design verification device.

In this case, the design verification device decrypts the encryption IP to the hardware IP by using the decryption key DK1 which is included in the control file 21 provided by the manufacturer. Then, depending on the process described in the control file 21, the design verification device replaces the box IP in the chip design data BCD with the decrypted hardware IP so as to perform the data verification. Here, the design verification device performs the processes from the decryption of the encryption IP to the data verification, in the storage area such as the RAM in the design verification device, which is hidden from outside of the design verification device.

When the chip designer determines that the chip design data BCD satisfies the verification criterion from the result of the data verification, the chip designer delivers the chip design data BCD to the manufacturer.

The manufacturer receives the encryption IP from the IP provider. The manufacturer decrypts the encryption IP to the hardware IP by using the decryption key DK1. Here, the manufacturer may receive the hardware IP from the IP provider. Like the method shown in FIG. 2, the manufacturer replaces the box IP in the chip design data BCD with the hardware IP so as to produce the chip design data HCD. Then, the manufacturer performs the data verifications such as the DRC, the LVS and the DFM of the chip design data HOD by using the design verification device once again. When the manufacturer determines that the chip design data HCD satisfies the verification criterion from the result of the data verification, the manufacturer starts manufacturing the chip based on the chip design data HCD.

A detailed explanation will be given of the control file 21 and the data verification by the chip designer.

As shown in FIG. 8, the control file 21 includes the decryption key DK1 for decrypting the encryption IP. Additionally, in the control file 21, the process (hereinafter suitably referred as "executable process") which can be executed to the chip design data replaced with the decrypted hardware IP is specified by the manufacture. The process other than the specified executable process cannot be performed to the chip design data replaced with the decrypted hardware IP. The process other than the specified executable process is the process (hereinafter suitably referred as "normal process") to the chip design data for which the box IP is used. The manufacturer produces the encryption key EK2 and the decryption key DK2 as the key pair, which are different from the encryption key EK1 and the decryption key DK1. The manufacturer encrypts the part of the executable process and the decryption key DK1 in the control file 21 by the encryption key EK2 and provides them to the chip designer.

A concrete explanation will be given of the control file 21, with reference to FIG. 10 to FIG. 12.

Figure 10:
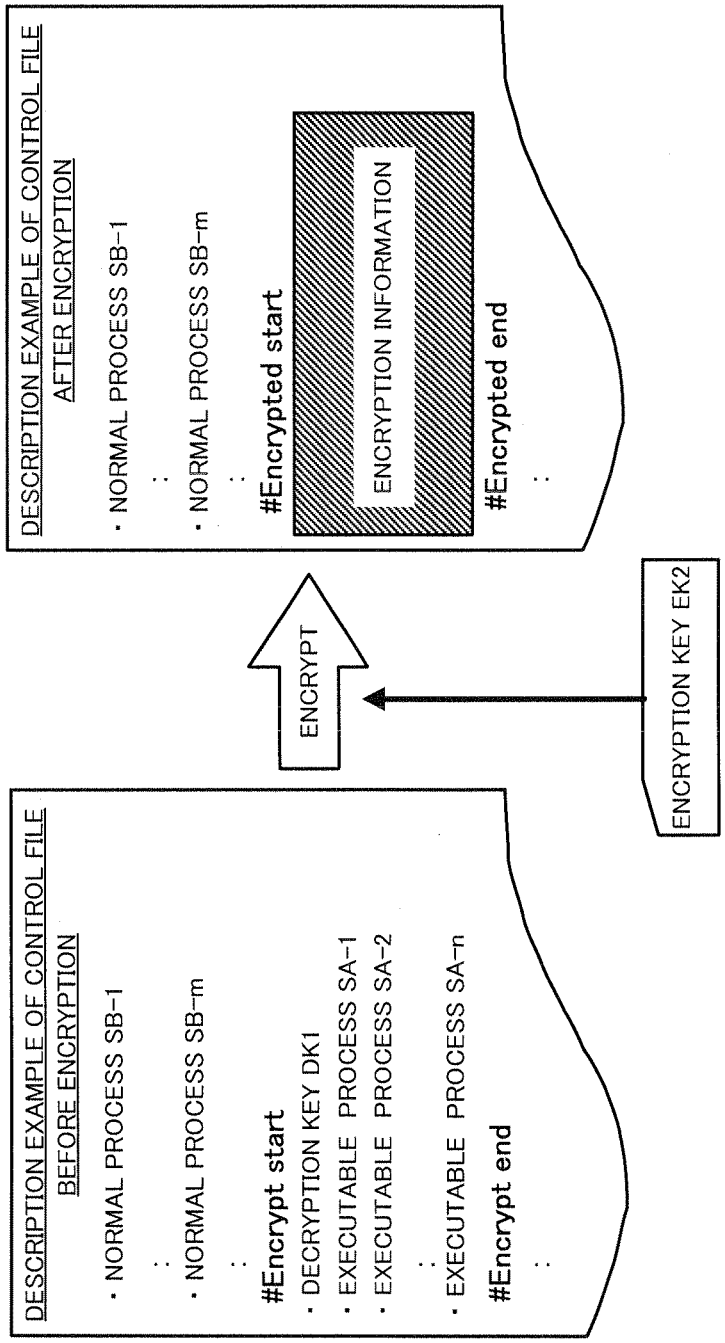
FIG. 10 is a diagram showing a description example of a control file.
Figure 11:
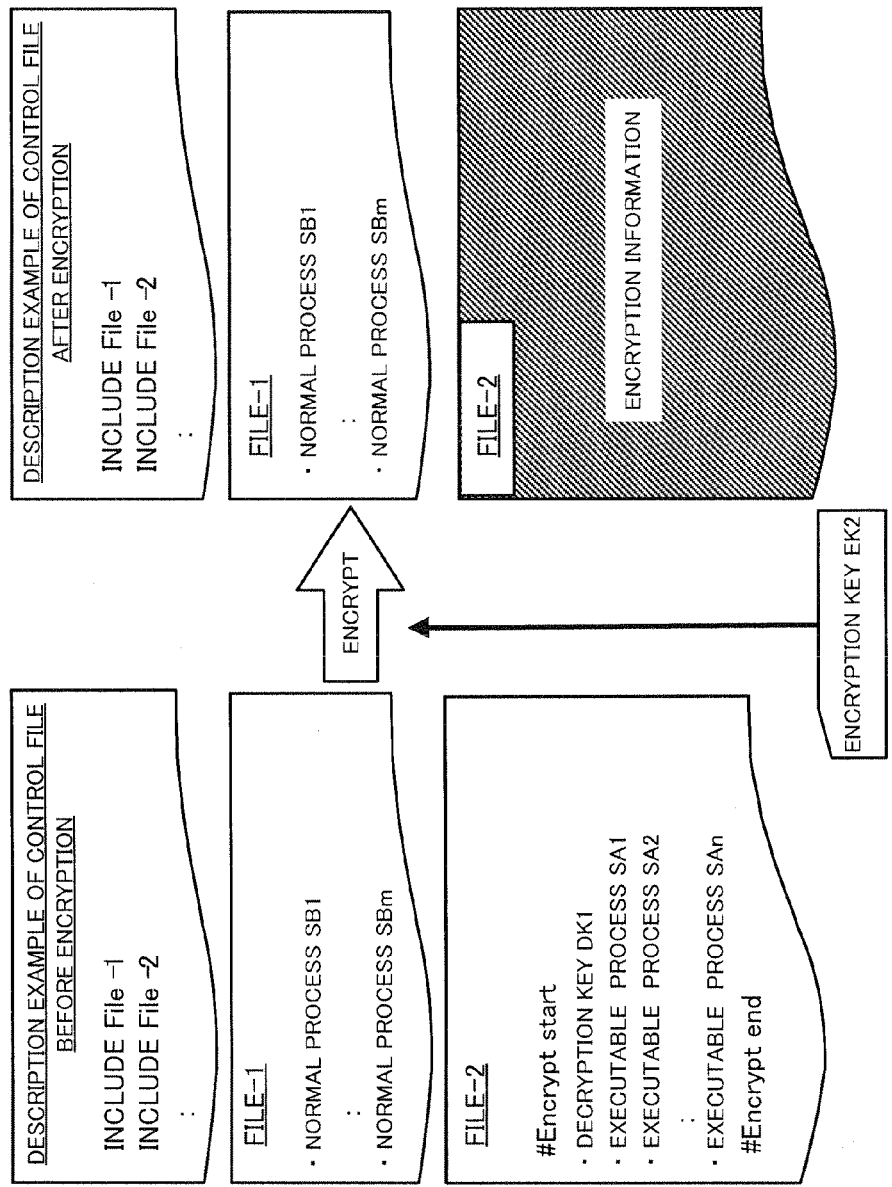
FIG. 11 is a diagram showing a description example of a control file.

FIG. 10 and FIG. 11 are diagrams showing description examples of the control file. In FIG. 10, the normal processes SB-1 to SB-n ("n" is integer number) indicate the normal process SB of the chip design data for which the box IP is used. The executable processes SA-1 to SA-m ("m" is integer number) indicate the executable process SA of the chip design data replaced with the decrypted hardware IP. The decryption key DK1 and the executable processes SA-1 to SA-m in the control file 21 are encrypted by the encryption key EK2. In FIG. 10, the part which is encrypted by the encryption key EK2 is shown as the encryption information. The encrypted control file 21 is provided to the chip designer. The reason why the decryption key DK1 and the executable process SA are encrypted is to prevent third parties such as the chip designer from altering the control file 21 and extracting the data of the encryption IP. Namely, by limiting the process of the encryption IP by the manufacturer and encrypting the process of the encryption IP, the information protection of the hardware IP is performed.

Though the manufacturer designates the part of the processes described in the control file 21 as the executable process SA, it is not limited to this. Needless to say, the manufacturer may designate all of the processes as the executable process SA. Additionally, instead of producing the control file 21 as one file, the control file 21 separated into the plural files may be produced, as shown in FIG. 11. In an example shown in FIG. 11, the control file 21 separated into the FILE-1 in which the normal process SB is described and the FILE-2 in which the executable process SA and the decryption key DK1 are described is produced. In this case, the entire FILE-2 is encrypted. Therefore, it is possible to encrypt the file more easily than the case of encrypting the part of the file.

A concrete explanation will be given of a producing method of the control file 21. The manufacturer produces the control file 21 by using the devices such as the EDA. Hereinafter, the devices such as the EDA, which have the function to produce the control file, are referred to as "control file producing device". The control file producing device is realized by executing the program on CPU in PC, for example.

Figure 12:
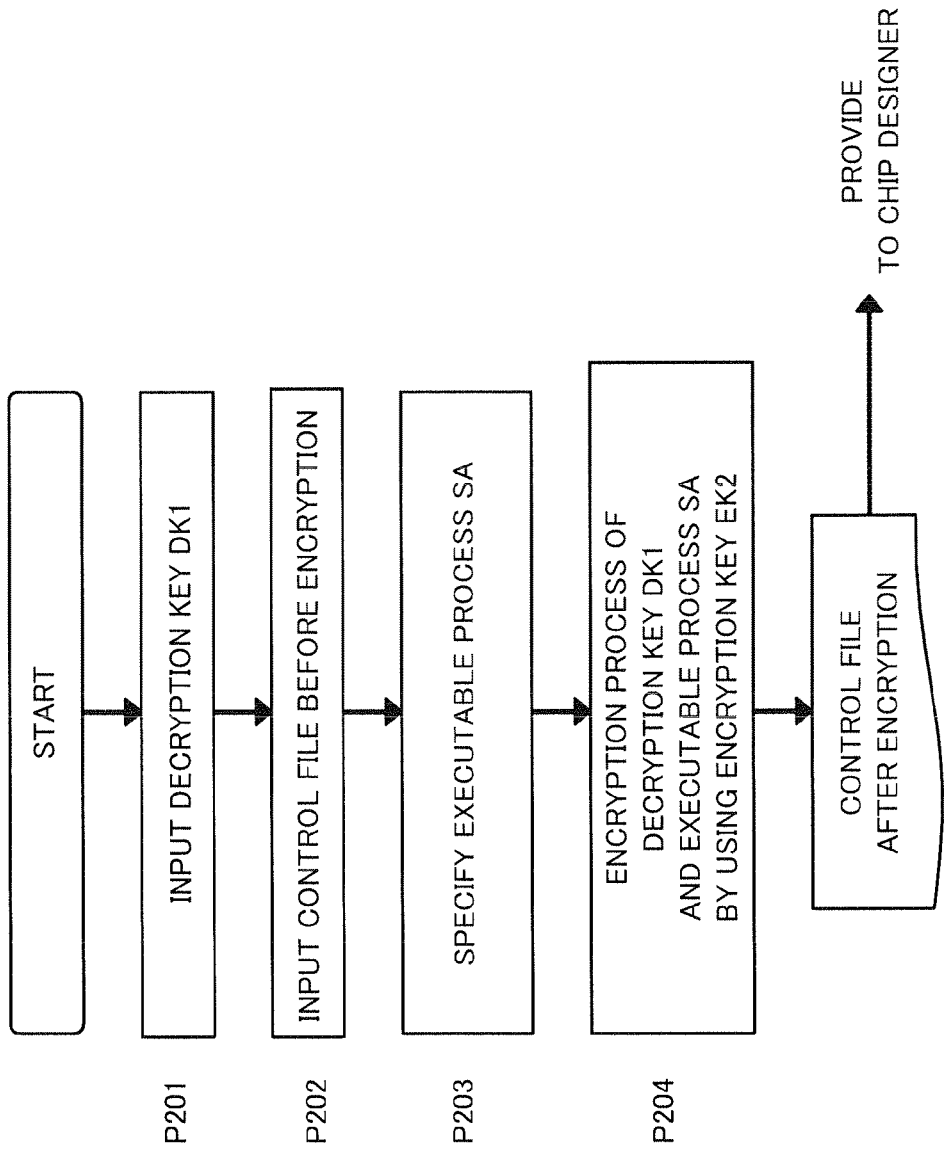
FIG. 12 is a flow chart showing a producing method of a control file.

Concretely, as shown in a flow chart of the producing method of the control file 21 in FIG. 12, at first, the decryption key DK1 is input to the control file producing device (step P201), and the control file 21 before the encryption is input to the control file producing device (step P202). After the control file 21 before the encryption is input to the control file producing device, the executable process SA is designated by the manufacturer (step P203). Then, the control file producing device performs the encryption process of the decryption key DK1 and the executable process SA by using the encryption key EK2 (step P204), and produces the encrypted control file 21. The above encrypted control file 21 is provided to the chip designer with the decryption key DK2.

As shown in above FIG. 8, the chip designer inputs the decryption key DK2 to the design verification device when the chip designer performs the data verification. The design verification device decrypts the encryption information in the control file 21 by using the inputted decryption key DK2.

Then, the design verification device decrypts the encryption IP to the hardware IP by using the decryption key DK1 included in the encryption information and replaces the box IP in the chip design data BCD with the decrypted hardware IP in performing the executable process SA. Here, the processes from the decryption of the encryption information to the performance of the data verification by replacing the box IP with the hardware IP are performed in the storage area such as the RAM in the design verification device, which is hidden from outside of the design verification device. This is because, when the encryption IP is decrypted to the hardware IP, third parties such as the chip designer are prevented from obtaining the data of the decrypted hardware IP.

Next, a description will be given of a flow of the design and verification operation of the distribution system shown in FIG. 8. As understood from the above explanation, like the flow of the design and verification operation of the distribution system shown in FIG. 2, the flow of the design and verification operation of the distribution system shown in FIG. 8 is performed by the chip design, the data verification by the chip designer, the IP replacement and the data verification by the manufacturer, in this order. Therefore, a flow chart showing the flow of the design and verification operation of the distribution system shown in FIG. 8 is similar to the flow chart shown in FIG. 6. Particularly, the operations of the manufacturer side including the IP replacement and the data verification by the manufacturer are similar to the operation shown in FIG. 6. So, hereinafter, a description will only be given of the operations of the chip designer including the chip design and the data verification by the chip designer.

Figure 13:
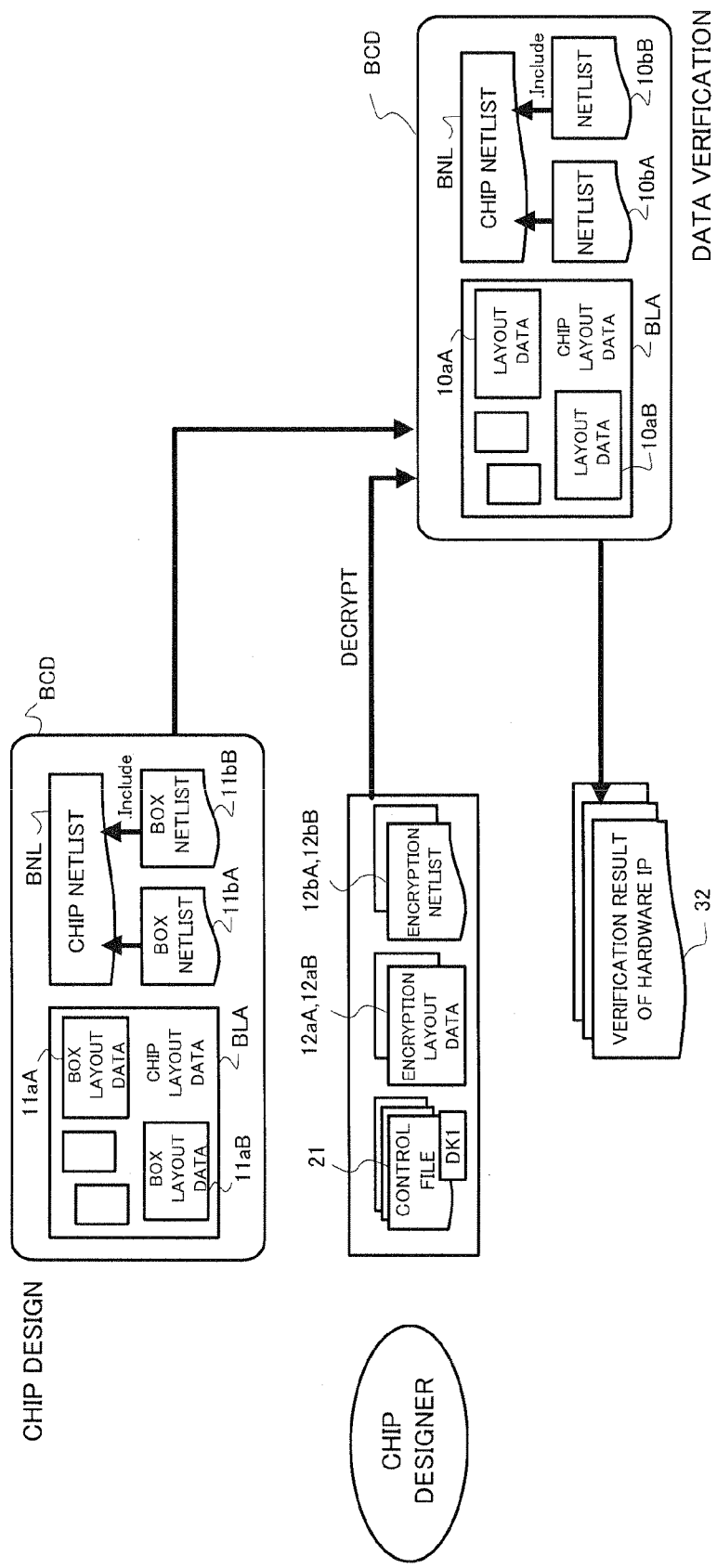
FIG. 13 is a diagram showing an example of a flow of a design and verification operation of a distribution system.

FIG. 13 is a diagram showing an example of the flow of the design and verification operation of the distribution system shown in FIG. 8. FIG. 13 shows each step of the chip design and the data verification by the chip designer.

As shown in FIG. 13, in the chip design step, the chip designer performs the layout design of the chip by using the box layout data 11$a$A of the box IP 11A and the box layout data 11$a$B of the box IP 11B so as to produce the chip layout data BLA. Additionally, the chip designer produces the chip netlist BNL, which is the circuit data of the chip, by using the box netlist 11$b$A of the box IP 11A and the box netlist 11$b$B of the box IP 11B.

In the data verification step by the chip designer, the chip designer performs the data verification of the chip design data BCD by using the design verification device.

Figure 14:
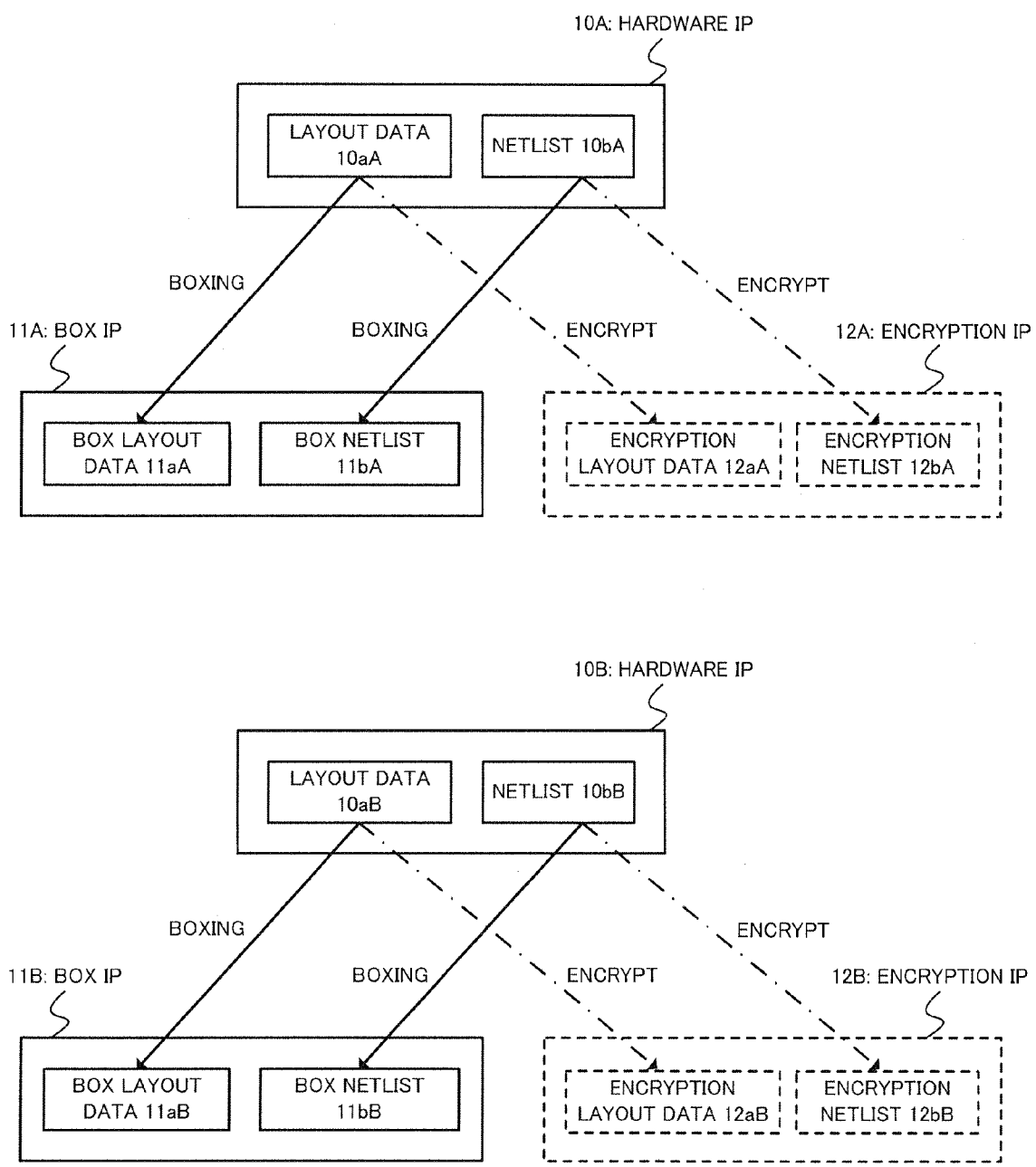
FIG. 14 is a diagram organizing a relationship between hardware IP, encryption IP and box IP.

In the distribution system shown in FIG. 8, the encryption IP 12A of the hardware IP 10A is provided to the chip designer from the IP provider A. For example, the encryption layout data 12$a$A that is the encrypted layout data 10$a$A and the netlist 12$b$A that is the encrypted netlist 10$b$A are provided to the chip designer. Additionally, the encryption IP 12B of the hardware IP 10B is provided to the chip designer from the IP provider B. For example, the encryption layout data 12$a$B that is the encrypted layout data 10$a$B and the netlist 12$b$B that is the encrypted netlist 10$b$B are provided to the chip designer. Here, FIG. 14 shows a diagram organizing the relationship between the hardware IP, the encryption IP and the box IP.

The design verification device performs the data verification of the chip design data BCD in accordance with the control file 21. In such a case that the design verification device performs the executable process SA, the design verification device replaces the box IP in the chip design data BCD with the hardware IP obtained by decrypting the encryption IP. As described above, from the standpoint of the information protection, this process is performed in the storage area such as the RAM in the design verification device, which is hidden from outside.

Concretely, the design verification device decrypts the encryption layout data 12$a$A and 12$a$B to the layout data 10$a$A and 10$a$B by using the decryption key DK1. Then, the design verification device replaces the box layout data 11$a$A and 11$a$B of the chip layout data BLA with the decrypted layout data 10$a$A and 10$a$B. Additionally, the design verification device decrypts the encryption netlist 12$b$A and 12$b$B to the netlist 10$b$A and 10$b$B by using the decryption key DK1. Then, the design verification device replaces the box netlist 11$b$A and 11$b$B of the chip netlist BNL with the decrypted netlist 10$b$A and 10$b$B.

The design verification device performs the executable process SA to the chip layout data BLA and the chip netlist BNL that the box IP is replaced with the decrypted hardware IP so as to output the verification result 32. The verification result 32 becomes the same as the result of the data verification by the manufacturer after the IP replacement step. Therefore, it is possible to prevent the difference between the result of the data verification by the chip designer and the result of the data verification by manufacturer from occurring and prevent the operation from returning to the chip design step.

Figure 15:
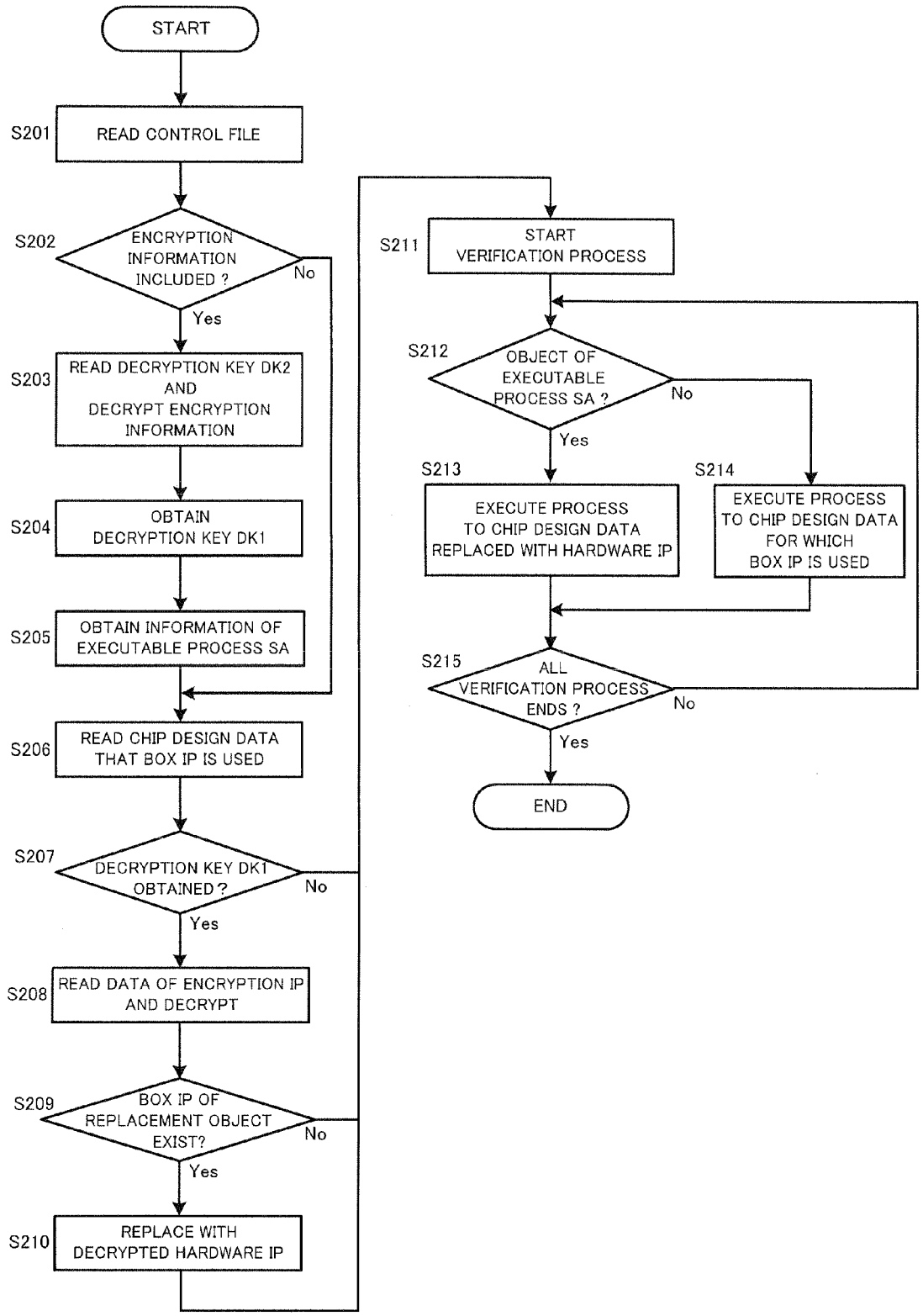
FIG. 15 is a flow chart showing an example of a data verification process.

Next, a description will be given of an example of the above data verification process, by using a flow chart in FIG. 15. As for the data verification process shown in the flow chart in FIG. 15, the object of the process is altered in case of performing the normal process SB and in case of performing the executable process SA. Concretely, the normal process SB is performed to chip design data for which the box IP is used, and the executable process SA is performed to the chip design data replaced with the decrypted hardware IP. Additionally, the data verification process is realized by executing the program on CPU in the design verification device and performed in the storage area such as the RAM in the design verification device, which is hidden from outside.

First, in step S201, the design verification device reads the control file 21. In this case, the design verification device obtains the normal process SB which is not decrypted. Next, in step S202, the design verification device determines whether or not the encryption information is included in the control file 21. When the design verification device determines that the encryption information is included in the control file 21 (step S202: Yes), the process goes to step S203. Meanwhile, when the design verification device determines that the encryption information is not included in the control file 21 (step S202: No), the process goes to step S206.

In step S203, the design verification device reads the decryption key DK2 and decrypts the encryption information in the control file 21. In step S204, the design verification device obtains the decryption key DK1 included in the encryption information. In step S205, the design verification device obtains the information of the executable process SA included in the encryption information. Then, the process goes to step S206.

In step S206, the design verification device reads the chip design data that the chip designer designs and for which the box IP is used. Next, in step S207, the design verification device determines whether or not the decryption key DK1 is obtained in step S204. When the design verification device determines that he decryption key DK1 is obtained (step S207: Yes), the process goes to step S208. Meanwhile, when the design verification device determines that the decryption key DK1 is not obtained (step S207: No), the process goes to step S211.

In step S208, the design verification device reads the data of the encryption IP and decrypts the encryption IP to the hardware IP by using the decryption key DK1. Next, in step S209, the design verification device determines whether or not the box IP which is the object of the replacement exists in the chip design data for which the box IP is used. For example, the design verification device determines whether or not the box IP of the replacement object exists by determining whether or not there is the name which coincides with the name of the decrypted hardware IP in the chip design data. If the name of the box IP is described by another name in the chip design data, the design verification device reads the file in which the transformation information of the name of the box IP is described and then determines whether or not there is the name which coincides with the name of the decrypted hardware IP. Instead, the design verification device may determine whether or not the box IP of the replacement object exists by confirming some kind of common information embedded in the decrypted hardware IP and the box IP. When the design verification device determines that the box IP of the replacement object exists (step S209: Yes), the process goes to step S210. Meanwhile, when the design verification device determines that the box IP of the replacement object does not exist (step S209: No), the process goes to step S211.

Figure 16A:
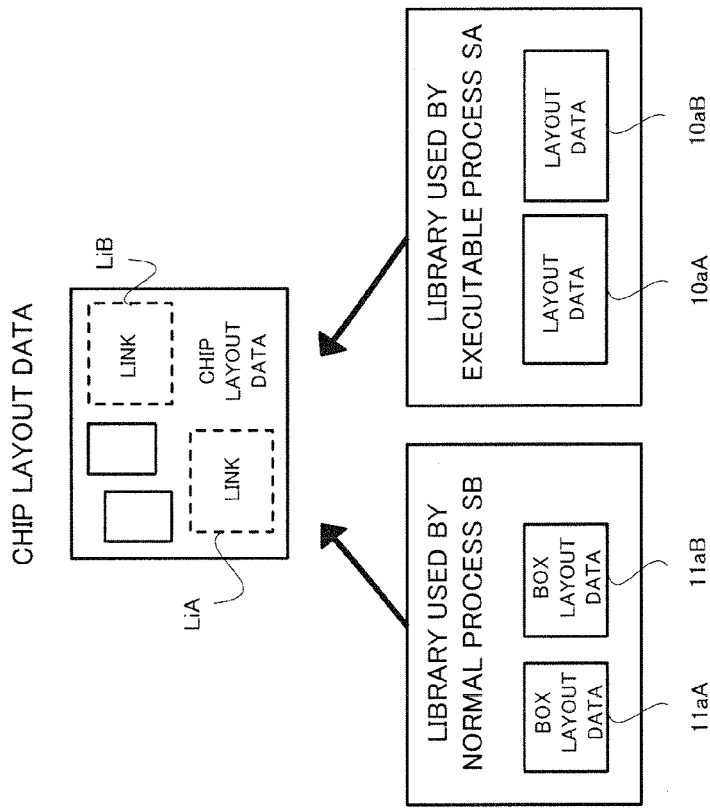
FIGS. 16A and 16B are diagrams showing examples of storing chip layout data.

In step S210, the design verification device replaces the box IP with the decrypted hardware IP so as to produce the chip design data. In this case, the design verification device has both the chip design data for which the box IP is used and the chip design data replaced with the decrypted hardware IP. For example, if a description will be given of an example of the chip layout data in the chip design data, the design verification device has the two chip layout data, as shown in FIG. 16A. One is the chip layout data BLA1 for which the box layout data 11$a$A and 11$a$B are used, and the other is the chip layout data BLA2 which is replaced with the decrypted layout data 10$a$A and 10$a$B. Then, the process goes to step S211.

In step S211, the design verification device starts the verification process which is read from the control file 21. Concretely, the design verification device starts the normal process SB and the executable process SA. Next, in step S212, the design verification device determines whether or not the process which is presently going to be performed is the executable process SA. When the design verification device determines that the process which is presently going to be performed is the executable process SA, the process goes to step S213. In step S213, the design verification device performs the process to the chip design data replaced with the decrypted hardware IP and the process goes to step S215. Meanwhile, when the design verification device determines that the process which is presently going to be performed is not the executable process SA in step S212, namely, when the design verification device determines that the process is the normal process SB, the process goes to step S214. In step S214, the design verification device performs the process to the chip design data for which the box IP is used and the process goes to step S215. For example, in the example of the chip layout data shown in FIG. 16A, in such a case that the process which is presently going to be performed is the normal process SB, the process is performed to the chip layout data BLA1 for which the box layout data is used. Meanwhile, in such a case that the process which is presently going to be performed is the executable process SA, the process is performed to the chip layout data BLA2 replaced with the decrypted layout data.

In step S215, the design verification device determines whether or not all of the verification process ends. When the design verification device determines that all of the verification process does not end, the process goes back to step S212 in order to perform the next verification process. Meanwhile, when the design verification device determines that all of the verification process ends, the verification process ends.

The above-mentioned data verification process is summarized as follows. When the encryption information is not included in the control file 21, the normal process SB is performed to the chip design data for which the box IP is used, without performing the decryption process. Meanwhile, when the encryption information is included in the control file 21, the decryption process is performed and the process is selectively performed to the chip design data for which the box IP is used and the chip design data for which the decrypted hardware IP is used. Namely, the normal process SB is performed to the chip design data for which the box IP is used, and the executable process SA is performed to the chip design data for which the decrypted hardware IP is used.

Figure 16B:
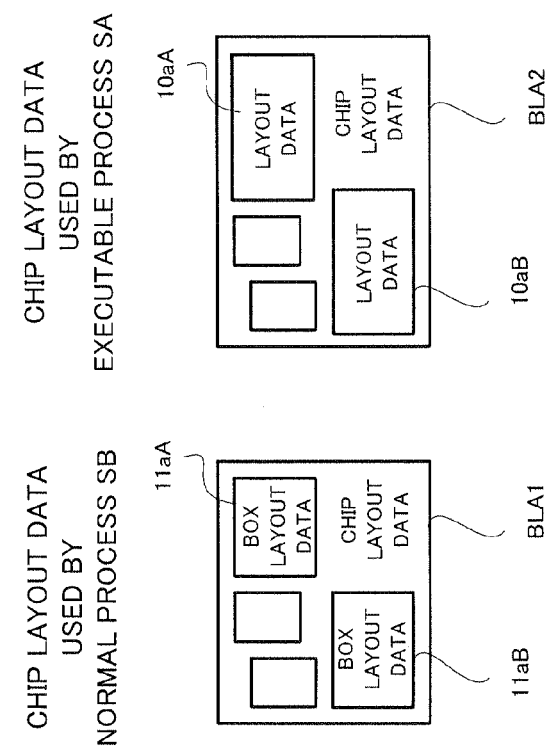

As for the chip layout data described in step S210, it is not limited that the design verification device stores the two chip layout data as shown in FIG. 16A. Instead, as shown in FIG. 16B, the design verification device may store the box layout data and the decrypted layout data, as the library, and then associate them with the chip layout data by the link. In this case, the design verification device associates the library with the chip layout data by each verification process. For example, in case of the executable process SA, the decrypted layout data 10$a$A is associated with the link LiA and the decrypted layout data 10$a$B is associated with the link LiB. Meanwhile, in case of the normal process SB, the box layout data 11$a$A is associated with the link LiA and the box layout data 11$a$B is associated with the link LiB. According to the example shown in FIG. 16B, compared to the example shown in FIG. 16A, it is possible to reduce the redundant data. Therefore, it is possible to improve the reduction of the memory usage and the shortening of the processing time.

In the above first embodiment, the description is given of the example of the case of performing the data verification by encrypting the layout data of the hardware IP and the netlist, but it is not limited to this. Needless to say, instead of or in addition to this, the first embodiment can be applied to the case of performing the data verification by encrypting the data other than the layout data of the hardware IP and the netlist.

Thus, according to the first embodiment, as for the chip design data designed by using the box IP, the design verification device decrypts the encryption IP to the hardware IP and replaces the box IP with the decrypted hardware IP so as to perform the data verification. Therefore, in the data verification step by the chip designer, it becomes possible to perform the data verification equivalent to the data verification by the manufacturer. So, it is possible to prevent the operation from returning to the chip design step. Additionally, in this case, the design verification device performs the decryption of the encryption IP and the data verification in the storage area such as the RAM where the storage data is hidden from outside. Therefore, the data of the hardware IP is not obtained by third parties such as the chip designer. Additionally, in this case, the operation flow of the design and the verification is the same as the operation flow shown in FIG. 6. Namely, according to the first embodiment, it is possible to improve both the information protection of the hardware IP and the accuracy of the data verification, without increasing the operation process of the design and the verification. Needless to say, instead of this, after the design verification device replaces the chip design data designed by using the box IP with the encryption IP, the design verification device may decrypt the encryption IP to the hardware IP so as to perform the data verification.

In addition, according to the first embodiment, the decryption key for decrypting the encryption IP and the executable process which can be executed to the chip design data replaced with the decrypted hardware IP are encrypted in the control file 21. Thus, it is possible to prevent third parties such as the chip designer from altering the control file 21 and extracting the data of the encryption IP.

In the first embodiment, the encryption IP and the box IP are provided to the chip designer by the different files, but it is not limited to this. Instead, the box IP may be produced by selectively encrypting the data of the hardware IP and provided to the chip designer. Therefore, since the box IP doubles as the encryption IP, it becomes possible to provide the encryption IP and the box P to the chip designer by one file. Additionally, in the first embodiment, the encryption IP and the control file 21 are provided to the chip designer by the different files, but it is not limited to this. Instead, the encryption IP may be included in the control file 21. Namely, the encryption IP may be provided as a part of the control file 21.

Additionally, in the first embodiment, the production of the control file 21 by the manufacturer is performed by the control file producing device and the data verification by the chip designer is performed by the design verification device. However, instead of this, the production of the control file 21 by the manufacturer and the data verification by the chip designer may be performed by the same device. In this case, from the standpoint of the information protection and the convenience of the operation, it is preferable that the decryption key DK2 for decrypting the encryption information in the control file 21 is produced and stored in the device. Namely, from the standpoint of the information protection and the convenience of the operation, it is preferable that the decryption key DK2 is not provided to the chip designer and the chip designer can perform the data verification process without inputting the decryption key DK2.

[Second Embodiment]

Next, a description will be given of a second embodiment. In the first embodiment, by using the encryption IP, the information protection of the hardware IP is improved and the accuracy of the data verification by the chip designer is also improved. However, depending on the manner of the chip design, in performing the data verification, third parties such as the chip designer sometimes obtain the data of the hardware IP which is not disclosed. Hereinafter, as a method for preventing this, a description will be given of examples of the DRC verification and the LVS verification.

(Case of DRC Verification)

At first, a description will be given of an example of the case of the DRC verification. When the chip designer produces the chip layout data, by appropriately arranging the external pattern, the chip designer may obtain the layout data of the hardware IP which is not disclosed, in the DRC verification. Hereinafter, the concrete explanation will be given by using FIG. 17.

FIG. 17A is a diagram showing a display example in case of performing the DRC verification to the chip layout data in which the pattern is arranged. In FIG. 17A, as for the chip layout data, the pattern 51 and the pattern 52 are arranged at the distance LL1. Here, for example, it is assumed that there is the design rule indicating that "the distance between the patterns must be set to Val or more", and that the design verification device verifies whether or not the design rule is satisfied, as the DRC verification. When the design verification device determines that the distance LL1 is smaller than the distance Val, the design verification device displays the error flag in the part of the pattern where the design rule is not satisfied. For example, the design verification displays the error flag P1 at the position of the pattern 51 and the pattern 52, as the verification result.

FIG. 17B is a diagram showing a display example in case of performing the DRC verification to the chip layout data in which the external pattern is arranged on the box layout data. In FIG. 17B, as for the chip layout data, the external pattern 53 is arranged on the box layout data 11a. Here, it is assumed that the box layout data 11a does not disclose any patterns. Like the above method, it is assumed that the design verification device verifies whether or not the design rule indicating that "the distance between the patterns must be set to Val or more" is satisfied, as the DRC verification. Hereinafter, it is assumed that the process of the DRC verification is the executable process.

As described in the first embodiment, after the design verification device starts the DRC verification, as for the chip design data, the design verification device replaces the box layout data 11a with the decrypted layout data 10a. In this case, the design verification device recognizes that the pattern 54 which is not disclosed in the box layout data 11a is arranged at the distance LL2 from the external pattern 53. Since the distance LL2 is smaller than the distance Val if the DRC verification is performed to the chip layout data to which the replacement is performed, the design verification device determines that the design rule is not satisfied and calculates the error flag so as to display the error flag. Concretely, the design verification displays the error flag P2 at the position of the pattern 53 and the pattern 54, as the verification result. In this case, as shown in FIG. 17B, the chip designer can know the part of the layout of the pattern 54 by observing the position and/or the length of error flag P2.

Namely, in such a case that third parties such as the chip designer appropriately arrange the external pattern near the box layout data and repeat the operation for outputting the error flag from the design verification device, there is a possibility that third parties obtain the layout of the pattern which should not be disclosed.

So, in such a case that the error of the layout data of the decrypted hardware IP occurs in case of performing the DRC verification, the design verification device converts the configuration of the error flag and outputs it. Hereinafter, a description will be given of two methods for converting the configuration of the error flag and outputting it, respectively.

Firstly, a description will be given of a first method for converting the configuration of the error flag and outputting it. In the first method, the design verification device converts the configuration of the error flag which occurs in the area of the layout data 10a or in the predetermined partial area and displays it. Hereinafter, the concrete explanation will be given by using FIG. 18.

Figure 18:
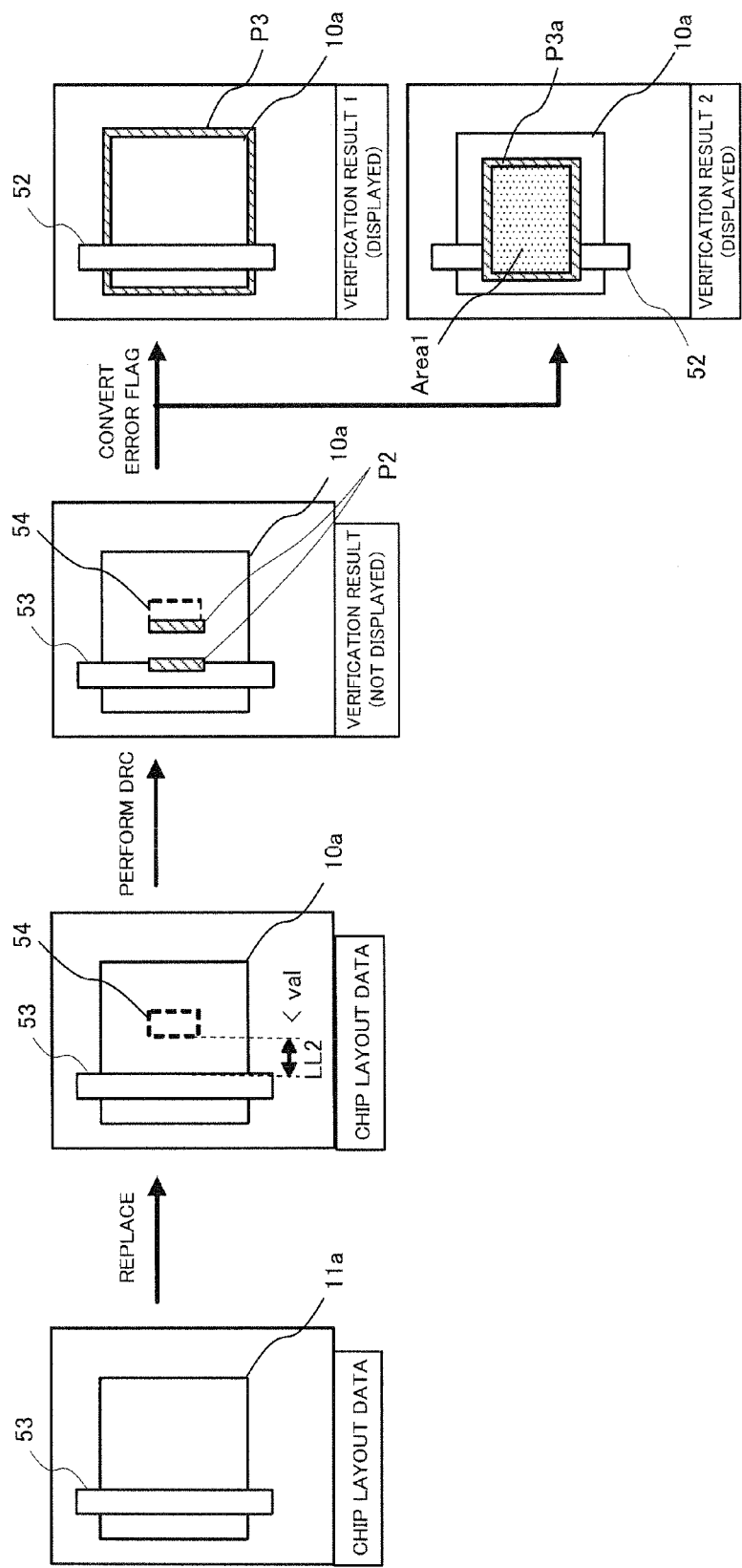
FIG. 18 is a diagram showing a display example in case of converting a configuration of an error flag and outputting it.

FIG. 18 is a diagram showing a display example in case of converting the configuration of the error flag and outputting it. Like the example shown in FIG. 17B, as for the chip layout data, the external pattern 53 is arranged on the box layout data 11a. Additionally, it is assumed that the design verification device verifies whether or not the design rule indicating that "the distance between the patterns must be set to Val or more" is satisfied, as the DRC verification. Like the method shown in FIG. 17B, as for the chip layout data, the design verification device replaces the box layout data 11a with the decrypted layout data 10a and performs the DRC verification so as to calculate the error flag P2.

Here, the design verification device determines whether or not the error flag P2 belongs to the layout data 10a without displaying the error flag P2. Then, when the design verification device determines that the error flag P2 belongs to the layout data 10a, the design verification device converts the error flag P2 and displays it. For example, as shown in the verification result 1, the design verification device converts the error flag P2 into the error flag P3 which has the configuration surrounding the layout data 10a (namely, the same as the configuration surrounding the box layout data 11a) and displays it. Thus, it is possible to prevent third parties such as the chip designer from extracting the layout of the pattern which should not be disclosed.

Here, as for the error flag indicating the arrangement boundary of the box layout data 11a, it is sometimes better to display the error flag to the chip designer without converting it. So, instead of the above method, the design verification device may convert the error flag and display it, in accordance with the area in the layout data 10a where the error flag occurs. For example, in the example of the verification result 2 shown in FIG. 18, the design verification device converts the error flag which occurs in the Area1 in the layout data 10a. Concretely, the design verification device converts the error flag which occurs in the Area1 in the layout data 10a into the error flag P3a which has the configuration surrounding the Area1 and displays the error flag P3a. Meanwhile, as for the error flag which occurs outside the Area1, even if the error flag occurs in the layout data 10a, the design verification device displays the error flag without converting it. The Area1 is preliminarily specified by the IP provider or the manufacturer based on the data included in the hardware IP.

Next, a description will be given of a second method for converting the configuration of the error flag and outputting it. In the second method, in addition to performing the DRC verification to the chip layout data replaced with the layout data, the design verification device performs the DRC verification to the chip layout data which remains in the use of the box layout data, too. Then, in accordance with the comparison result indicating the comparison of both verification results, the design verification device determines whether the error flag is displayed as it is or the converted error flag is displayed. Hereinafter, the concrete explanation will be given by using FIG. 19 and FIG. 20.

Figure 19:
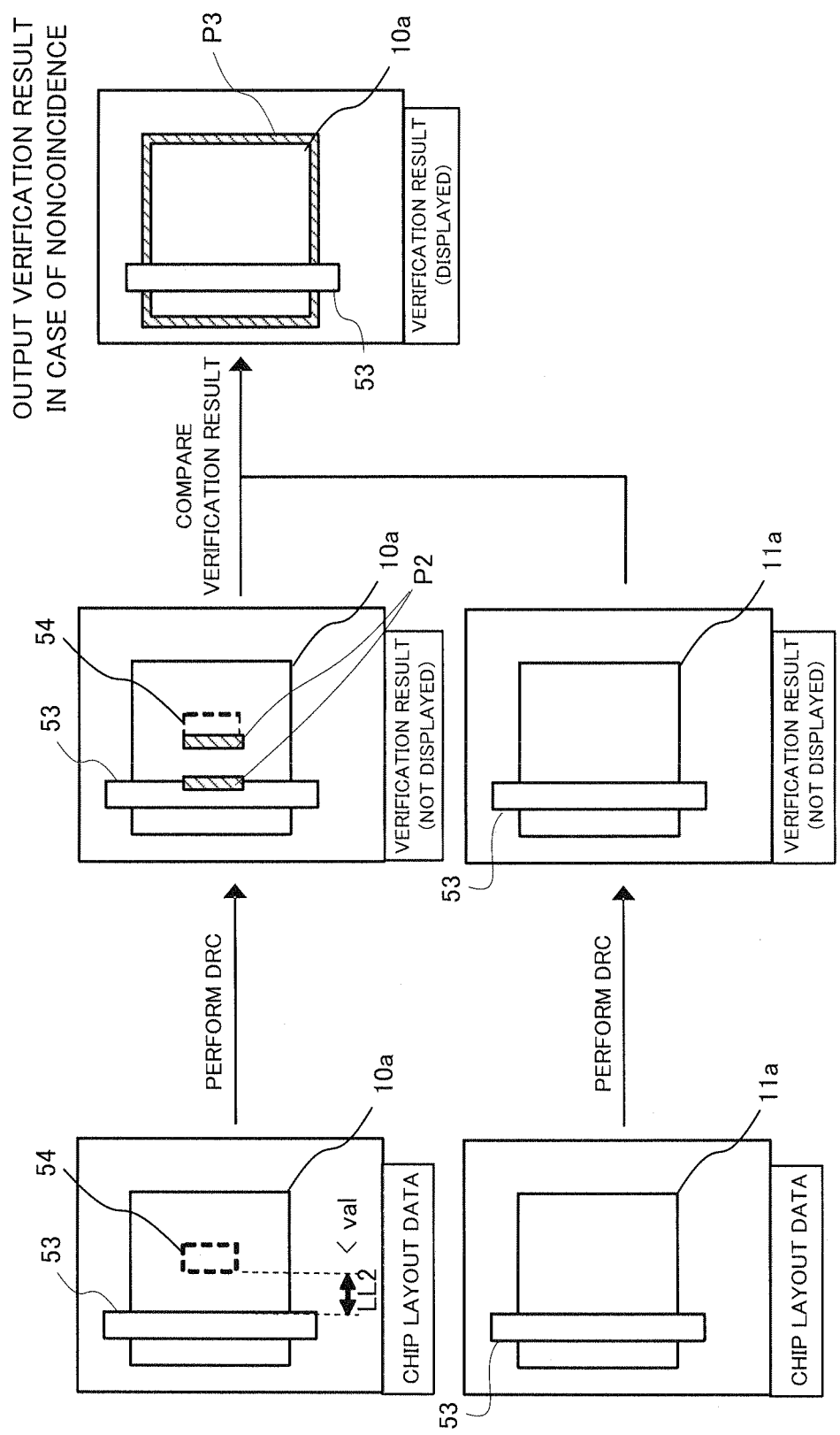
FIG. 19 is a diagram showing a display example in case of converting a configuration of an error flag and outputting it.

FIG. 19 and FIG. 20 are diagrams showing display examples in case of converting the configuration of the error flag and outputting it. In FIG. 19, as for the chip layout data, the design verification device performs the DRC verification by replacing the box layout data 11a with the decrypted layout data 10a, and then the design verification device determines that the distance LL2 is smaller than the distance Val and calculates the error flag P2. In addition to this, the design verification device performs the DRC verification to the chip layout data which remains in the use of the box layout data 11a, too. In this case, since the pattern 54 is not disclosed in the box layout data 11a, the design verification device determines that the design rule is satisfied and does not calculate the error flag.

Here, the design verification device compares the verification result of the DRC verification of the chip layout data replaced with the layout data 10a, with the verification result of the DRC verification of the chip layout data which remains in the use of the box layout data 11a.

When both the verification results do not coincide, the design verification device converts the error flag P2 which is calculated by the DRC verification of the chip layout data replaced with the layout data and displays it. Meanwhile, when both the verification results coincide, the design verification device outputs the error flag as it is without converting it.

In an example shown in FIG. 19, since both the verification results do not coincide, the design verification device converts the error flag P2 into the error flag P3 and displays the error flag P3, for example. Needless to say, instead of converting the error flag P2 into the error flag P3 and displaying the error flag P3, like the method shown in FIG. 18, the design verification device may convert the error flag into the error flag which has the configuration surrounding the predetermined area in the layout data 11a and display it.

FIG. 20 shows an example in such a case that both the verification results coincide. In the example shown in FIG. 20, the pattern 54 is disclosed in the box layout data 11a. In this case, the verification result of the DRC verification of the chip layout data replaced with the layout data coincides with the verification result of the DRC verification of the chip layout data which remains in the use of the box layout data. Concretely, in either verification result, the error flag P2 is calculated. In this case, the design verification device outputs the error flag P2 without converting it.

According to the second method, the error flag of the pattern which is already disclosed in the box layout data 11a is displayed to the chip designer, and the error flag of the pattern which is not disclosed in the box layout data 11a is not displayed to the chip designer. Therefore, without being specifically designated by the control file by the IP provider or the manufacturer, it becomes possible to protect the data which is not disclosed in the box layout data 11a from third parties such as the chip designer.

By the above-mentioned method, it becomes possible to improve the information protection of the layout data of the hardware IP in case of performing the DRC verification.

In the above first and second methods, the design verification device estimates the error which occurs in the layout data 10a by the interference from the external layouts such as the external pattern. However, besides the error which occurs by the interference from the external layouts, the error which occurs in the layout data 10a includes the error (hereinafter referred to as "simulated error") which occurs by other reasons than this. Therefore, for example, if the design verification device converts all of the error flags which occur in the layout data 10a and display them, there is a possibility to be unable to discriminate the error by the interference from the external layouts from the simulated error. So, it is preferable that the design verification device preliminarily removes the simulated error and performs the DRC verification by using the first and second methods. For example, it is preferable that the design verification device preliminarily reads the file which includes the information required for removing the simulated error and removes the simulated error based on the file.

(Case of LVS Verification)

Next, a description will be given of an example of the case of the LVS verification. Hereinafter, a description will be given of a structure for protecting the circuit data of the hardware IP (concretely the information of the netlist) in case of performing the LVS verification, by developing the first and second methods described in the case of the DRC verification.

The LVS verification verifies whether or not the circuit data (concretely the chip netlist) which is extracted based on the chip layout data coincides with the circuit data which is designed by the logic circuit design of the chip. In case of performing the LVS verification, in view of the ease of the debug in the occurrence of the error, the design verification device sometimes outputs the chip netlist. Here, it is considered the case that the design verification device outputs the chip netlist based on the chip layout data for which the box layout data is replaced with the layout data of the hardware IP. In this case, based on the chip layout data, the design verification device produces the chip netlist by using the netlist of the decrypted hardware IP. Thereby, in this case, third parties such as the chip designer may obtain the netlist of the hardware IP based on the outputted chip netlist.

So, in case of performing the LVS verification, the design verification device performs the converting process to the part of the netlist of the hardware IP in the output chip netlist.

Concretely, in the first method, like the first method described in the case of the DRC verification, the design verification device removes the part of the netlist of the hardware IP in the output chip netlist. Instead, in the part of the netlist of the hardware IP in the output chip netlist, the design verification device may remove the data other than the preliminarily specified data. The second method may use the same method as the second method described in the case of the DRC verification. Namely, the design verification device may compare the part of the netlist of the hardware IP in the outputted chip netlist with the box netlist, and remove the data which does not coincide with the box netlist. Therefore, it becomes possible to improve the information protection of the netlist of the hardware IP.

A description will be given of a flow of the above LVS verification by using FIG. 21. FIG. 21 is a flow chart showing the process of the LVS verification.

First, the design verification device reads the control file 21 (step S301). Then, the design verification device reads the chip layout data in accordance with the control file 21 (step S302), and the design verification device extracts the circuit data, concretely, the chip netlist (step S304). Additionally, in accordance with the control file 21, the design verification device reads the circuit data designed by the logic circuit design of the chip (step S303). Then, the design verification device verified whether or not the circuit data extracted from the chip layout data coincides with the circuit data designed by the logic circuit design (step S305).

Next, the design verification device performs the converting process to the circuit data extracted from the chip layout data (step S306). For example, as described in the first method, the design verification device removes all parts of the netlist of the hardware IP in the chip netlist, or the design verification device removes the data other than the preliminarily specified data in the netlist of the hardware IP. Afterward, the design verification device outputs the circuit data extracted from the chip layout data, concretely, the chip netlist to which the converting process is performed (step S307). Then, the LVS process ends.

By the above-mentioned method, it becomes possible to improve the information protection of the netlist of the hardware IP in case of performing the LVS verification.

The above-mentioned second embodiment is summarized as follows. In the first method, in such a case that the information such as the error flag indicating the data of the hardware IP is included in the result of the data verification, the design verification device outputs the verification result after performing the converting process to the information. Therefore, it becomes possible to improve the information protection of the hardware IP. Additionally, in the second method, the design verification device compares the first verification result of the data verification of the chip design data which remains in use of the box IP with the second verification result of the data verification of the chip design data which is replaced with the decrypted hardware IP. Then, in such a case that the information such as the error flag indicating the data of the hardware IP is not included in the first verification result but included in the second verification result, the design verification device outputs the verification result after performing the converting process to the information. Therefore, without specifically being designated by the control file by the IP provider or the manufacturer, it becomes possible to protect the data which is not disclosed in the box IP from third parties such as the chip designer.

The examples of the cases of the DRC verification and the LVS verification are described in the second embodiment, but the above first or second method can be applied to the other verifications such as the DFM, for example. Concretely, in such a case that the information indicating the data of the hardware IP is included in the result in case of performing the other data verifications such as the DFM, the design verification device may output the result after converting the information by using the above first or second method.

The embodiment is not limited to the example of the above-described first and second embodiments, and various changes may be made, if desired, without departing from the essence or spirit of the invention which can be read from the claims and the entire specification.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiments of present inventions have been described in detail, it should be understood that the various changes, substitutions, and alterations could be made hereto without departing from the spirit and scope of the invention.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on non-transitory computer-readable media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

What is claimed is:

1. A design verification device comprising:
   a verification unit configured to perform a data verification of design data of a semiconductor chip designed by replacing hardware Intellectual Property including layout data and netlist of a circuit block with box Intellectual Property produced from data that is disclosed to a designer of the hardware Intellectual Property; and
   an obtaining unit configured to obtain encryption Intellectual Property including part or all of data of the hardware Intellectual Property being encrypted;
   wherein, in a storage area where storage data is hidden from outside, the verification unit decrypts the encryption Intellectual Property and replaces the box Intellectual Property with decrypted encryption Intellectual Property so as to perform the data verification;
   wherein the verification unit compares a first verification result of the data verification that is performed on the design data designed by using the box Intellectual Property without replacing the box Intellectual Property with the decrypted encryption Intellectual Property, with a second verification result of the data verification that is performed by replacing the box Intellectual Property with the decrypted encryption Intellectual Property, and wherein, in such a case that information indicating the layout data of the hardware Intellectual Property is not included in the first verification result but included in the second verification result, the verification unit converts the information and outputs the second verification result.

2. The design verification device according to claim 1, further comprising a control file in which a process of the data verification is described, wherein the control file includes encryption information including encrypted information of a decryption key for decrypting the encryption Intellectual Property and encrypted information of an executable process which is executed to the design data obtained by replacing the box Intellectual Property with the decrypted encryption Intellectual Property, and wherein, in the storage area, the verification unit decrypts the encryption information and performs the data verification in accordance with the executable process.

3. The design verification device according to claim 1, wherein the verification unit verifies whether or not layout data of the semiconductor chip satisfies a design rule, as the data verification, and wherein the verification unit displays a converted error flag of a part of the layout data which does not satisfy the design rule.

4. The design verification device according to claim 1, wherein the verification unit verifies whether or not circuit data extracted from layout data of the semiconductor chip coincides with circuit data produced in a design step of a logic circuit, and wherein the verification unit converts a part of circuit data of the hardware Intellectual Property in the circuit data extracted from the layout data, and outputs the converted data, as the result of the data verification.

* * * * *